US011635915B2

(12) United States Patent
Yeh et al.

(10) Patent No.: US 11,635,915 B2
(45) Date of Patent: Apr. 25, 2023

(54) MANAGING MEMORY RELIABILITY IN MEMORY SYSTEMS

(71) Applicant: Macronix International Co., Ltd., Hsinchu (TW)

(72) Inventors: Yuchih Yeh, Hsinchu (TW); Naiping Kuo, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 86 days.

(21) Appl. No.: 17/204,138

(22) Filed: Mar. 17, 2021

(65) Prior Publication Data

US 2022/0300200 A1    Sep. 22, 2022

(51) Int. Cl.
| | |
|---|---|
| G06F 12/00 | (2006.01) |
| G06F 3/06 | (2006.01) |
| G11C 16/26 | (2006.01) |
| G11C 16/04 | (2006.01) |
| G11C 16/34 | (2006.01) |
| G11C 11/56 | (2006.01) |

(52) U.S. Cl.
CPC .......... G06F 3/0659 (2013.01); G06F 3/0619 (2013.01); G06F 3/0679 (2013.01); G11C 16/0483 (2013.01); G11C 16/26 (2013.01); G11C 11/5642 (2013.01); G11C 16/349 (2013.01); G11C 16/3418 (2013.01)

(58) Field of Classification Search
CPC .... G06F 3/0659; G06F 3/0619; G06F 3/0679; G11C 16/0483; G11C 16/26; G11C 11/5642; G11C 16/3418; G11C 16/349

USPC ......................................................... 711/103
See application file for complete search history.

(56) References Cited

U.S. PATENT DOCUMENTS

| | | | | |
|---|---|---|---|---|
| 2021/0166774 A1* | 6/2021 | Cha | ......................... | G11C 16/26 |
| 2021/0264986 A1* | 8/2021 | Kim | ..................... | G11C 29/021 |

FOREIGN PATENT DOCUMENTS

| | | | | | |
|---|---|---|---|---|---|
| CN | 101241759 A | * | 8/2008 | ......... | G11C 11/5635 |
| CN | 112447207 A | * | 3/2021 | .......... | G06F 3/0604 |
| JP | H0642225 B2 | * | 6/1994 | | |
| JP | H0642225 B2 | * | 3/1995 | | |
| JP | H0719242 B2 | * | 3/1995 | | |

* cited by examiner

Primary Examiner — Mardochee Chery
(74) Attorney, Agent, or Firm — Fish & Richardson P.C.

(57) ABSTRACT

Methods, devices, systems, and apparatus including computer-readable mediums for managing memory reliability in memory systems are provided. In one aspect, a memory system includes a memory device having a plurality of blocks and a memory controller coupled to the memory device. The memory controller is configured to send a read command to the memory device, and the read command includes address information of at least one block in the memory device. The memory device is configured to: determine whether the read command comprises an indication for enabling adjusted read level determination, in response to determining that the read command comprises the indication for enabling the ARL determination, determine at least one adjusted read voltage for the at least one block, and execute a read operation based on the at least one adjusted read voltage according to the read command.

23 Claims, 21 Drawing Sheets

Parameter Table

| Block number | Retention time (hr) | Erase cycle count | Read disturb count | Write temperature (°C) |
|---|---|---|---|---|
| Block 0 | 1 | 10 | 1000 | 20 |
| Block 1 | 1000 | 20 | 10000 | 30 |
| Block 2 | 100000 | 100 | 100000 | 50 |
| ... | ... | ... | ... | ... |
| Block n-1 | 1000 | 20 | 100 | 40 |
| Block n | 100000 | 30 | 100000 | 50 |

FIG. 3

ARL Calculation Module 802

ARL calculation unit 804

810 Erase cycle count

| 0~499 | 500~999 | ...... | 2500~2999 |
|---|---|---|---|
| α1 | α2 | ...... | αN |

812 Retention time

| 0~9999 | 10000~19999 | ...... | 100000~999999 |
|---|---|---|---|
| β1 | β2 | ...... | βN |

814 Read disturb count

| 0~9999 | 10000~19999 | ...... | 1000000~9999999 |
|---|---|---|---|
| γ1 | γ2 | ...... | γN |

816 Temperature offset

| 0~19 | 20~39 | ...... | 80~99 |
|---|---|---|---|
| δ1 | δ2 | ...... | δN |

818 Block physical location

| Heavy strong | Slight strong | ...... | Heavy weak |
|---|---|---|---|
| ε1 | ε2 | ...... | εN |

820 Page physical location

| Heavy strong | Slight strong | ...... | Heavy weak |
|---|---|---|---|
| ζ1 | ζ2 | ...... | ζN |

MANAGING MEMORY RELIABILITY IN MEMORY SYSTEMS

BACKGROUND

Some memory devices, e.g., NAND flash memories, experience data corruption that may impact data integrity. To prevent the data corruption, memory controllers can correct deficient memory cells or erase memory blocks suffering from severe data integrity.

SUMMARY

The present disclosure describes systems and techniques for managing memory reliability in memory systems, e.g., non-volatile memory systems such as NAND flash memories, particularly by providing adjusted read levels for memory blocks/pages having data integrity or reliability issues.

One aspect of the present disclosure features a memory system including: a memory device including a plurality of blocks and a memory controller coupled to the memory device and configured to send a read command to the memory device, the read command including address information of at least one block in the memory device. The memory device is configured to: determine whether the read command includes an indication for enabling adjusted read level (ARL) determination; in response to determining that the read command includes the indication for enabling the ARL determination, determine at least one adjusted read voltage for the at least one block; and execute a read operation based on the at least one adjusted read voltage according to the read command.

The at least one adjusted read voltage can be different from at least one default read voltage for the at least one block.

In some implementations, the memory controller is configured to: determine whether or not to enable the ARL determination for the read command; and in response to determining to enable the ARL determination for the read command, send a specified command to the memory device, the specified command including ARL information for determining the at least adjusted read voltage for the at least one block in the memory device.

In some implementations, the memory controller is configured to maintain first parameter data of first parameters associated with the blocks in a parameter table of the memory controller, and the memory controller is configured to determine whether or not to enable the ARL determination for the read command based on corresponding first parameter data associated with the at least one block.

In some implementations, the memory device is configured to: receive the specified command from the memory controller; store the ARL information in the memory device; and determine the at least one adjusted read voltage based on the stored ARL information.

In some implementations, the ARL information includes: first parameter data of at least one first parameter associated with the at least one block or ARL data for the at least one block. The at least one first parameter can include at least one of retention time, erase cycle count, read disturbance count, or write temperature. The first parameter data can include at least one respective value of the at least one first parameter for the at least one block, and the ARL data can include at least one read voltage offset for the at least one block.

In some implementations, the memory controller is configured to: in response to determining that the ARL information includes the first parameter data, set a control flag in the memory device to indicate the ARL determination based on the first parameter data; and store the first parameter data in a first internal memory in the memory device.

In some implementations, the memory controller is configured to: determine second parameter data of at least one second parameter for the at least one block based on the read command; and in response to determining that the control flag indicates the ARL determination based on the first parameter data, determine the at least one adjusted read voltage based on the first parameter data stored in the first internal memory and the second parameter data of the at least one second parameter.

In some implementations, the memory controller includes an internal parameter circuit configured to store the second parameter data of the at least second parameter.

In some examples, the at least one second parameter includes at least one of a block physical location in the memory device, a page physical location in the memory device, or an internal temperature of the memory device, and the second parameter data includes at least one respective value for the at least one second parameter.

In some implementations, the memory device includes a temperature sensor configured to measure the internal temperature in the memory device.

In some implementations, the memory device is configured to: determine, for each read voltage of the at least one block, a respective predefined offset for each parameter of the at least one first parameter and the at least one second parameter based on the first parameter data and the second parameter data; and determine a corresponding adjusted read voltage for the at least one block based on the read voltage and the respective predefined offsets of the at least one first parameter and the at least one second parameter for the read voltage. The corresponding adjusted read voltage can be identical to a sum of the read voltage and the respective predefined offsets for the read voltage.

In some implementations, the memory device is configured to: maintain, for each parameter of the at least one first parameter and the at least one second parameter, a respective table associating predefined offsets with corresponding values of the parameter.

In some examples, the at least one first parameter includes a write temperature, and the at least one second parameter includes an internal temperature of the memory device, and the memory device can be configured to maintain a corresponding table for a temperature offset between the write temperature and the internal temperature, the corresponding table associating corresponding predefined offsets with different temperature offset ranges.

In some implementations, the memory device is configured to: in response to determining that the ARL information includes the ARL data, set a control flag in the memory device to indicate the ARL determination based on the ARL data; store the ARL data in a second internal memory of the memory device; and determine the at least one adjusted read voltage based on the ARL data stored in the second internal memory.

In some examples, the ARL data for the at least one block includes at least one read voltage offset for at least one read voltage of the at least one block, and each adjusted read voltage is identical to a sum of a read voltage and a corresponding read voltage offset.

In some examples, the specified command includes a command cycle code, an address cycle code, and at least one data cycle code, and the ARL information is included in the at least one data cycle code.

In some implementations, the memory device includes multiple planes having the plurality of blocks, and at least one of the command cycle code or the address cycle code is configured to select a single plane for a single plane operation or an individual plane for a multi-plane operation.

In some implementations, the read command includes a prefix cycle code and a command cycle code, and one of the prefix cycle code and the command cycle code is configured to include the indication for enabling the ARL determination.

In some implementations, the memory device includes multiple planes having the plurality of blocks, the read operation is a multi-plane operation, and the at least one block includes a respective block in each plane of the planes. The memory device can be configured to: determine, for each of the respective blocks in the planes, a different corresponding adjusted read voltage.

In some implementations, the memory device is configured to: sequentially receive a respective specified command for each plane of the planes from the memory controller, the respective specified command including corresponding ARL information for determining the different corresponding adjusted read voltage for the respective block in the plane; sequentially receive a respective read command for each plane of the planes from the memory controller; determine, for each of the respective blocks in the planes, the different corresponding adjusted read voltage based on the corresponding ARL information and the respective read command; execute the multi-plane operation based on the corresponding adjusted read voltages for the respective blocks in the planes according to the respective read commands; and sequentially output respective memory data read from each of the respective blocks in the planes to the memory controller.

Another aspect of the present disclosure features a memory system including: a memory device including a plurality of blocks; and a memory controller coupled to the memory device and configured to maintain first parameter data of at least one first parameter associated with the blocks. The memory device is configured to determine at least one read voltage for a specified block in the blocks based on corresponding first parameter data for the specified block from the memory controller.

In some implementations, the memory device is configured to determine second parameter data of at least one second parameter for the specified block, and the memory device is configured to determine the at least one read voltage for the specified block based on corresponding second parameter data for the specified block.

In some examples, the first parameters include at least one of retention time, erase cycle count, read disturbance count, or write temperature, and the second parameters include at least one of a block physical location, a page physical location, or an internal temperature.

Another aspect of the present disclosure features a memory device including: a memory cell array having a plurality of blocks; and an internal controller coupled to the memory cell array and configured to: receive a read command from a memory controller, the read command including address information of at least one block in the memory cell array; determine whether the read command includes an indication for enabling adjusted read level (ARL) determination; in response to determine that the read command includes the indication for enabling the ARL determination, determine at least one adjusted read voltage for the at least one block; and execute a read operation based on the at least one adjusted read voltage according to the read command.

In some implementations, the internal controller includes an ARL circuit configured to: receive first parameter data of at least one first parameter for the at least one block from the memory controller; determine second parameter data of at least one second parameter for the at least one block; and determine the at least one adjusted read voltage for the at least one block based on the first parameter data and the second parameter data.

In some implementations, the internal controller includes: an internal parameter circuit configured to store the second parameter data of the at least one parameter. In some implementations, the internal controller includes an ARL circuit including: a first internal memory configured to store ARL parameters received from the memory controller; a second internal memory configured to store ARL data received from the memory controller; and an ARL control circuit including: a control flag register configured to store an indication of ARL determination from one of the ARL parameters and ARL data; and an ARL calculation circuit configured to calculate the at least one adjusted read voltage for the at least one block based on the one of the ARL parameters and ARL data according to the indication in the control flag register.

In some implementations, the ARL calculation circuit includes: a plurality of predefined offset tables for the at least one first parameter and the at least one second parameter, and each of the predefined offset tables is configured to associate predefined offsets with corresponding values of a corresponding parameter.

In some implementations, the ARL calculation circuit is configured to: determine, for each read voltage of the at least one block, a respective predefined offset for each parameter of the at least one first parameter and the at least one second parameter based on the first parameter data and the second parameter data; and determine a corresponding adjusted read voltage for the at least one block based on the read voltage and the respective predefined offsets of the at least one first parameter and the at least one second parameter for the read voltage.

Another aspect of the present disclosure features a method including: receiving a read command from a memory controller by a memory device, the read command including address information of at least one block in the memory device; determining whether the read command includes an indication for enabling adjusted read level (ARL) determination; in response to determining that the read command includes the indication for enabling the ARL determination, determining at least one adjusted read voltage for the at least one block by the memory device; and executing a read operation based on the at least one adjusted read voltage according to the read command by the memory device.

In some implementations, the at least one adjusted read voltage is different from at least one default read voltage for the at least one block.

In some implementations, the method further includes: receiving a specified command from the memory controller by the memory device, the specified command including ARL information for determining the at least adjusted read voltage for the at least one block in the memory device; and storing the ARL information in the memory device. Determining at least one adjusted read voltage for the at least one block by the memory device can include: determining the at least one adjusted read voltage based on the stored ARL information in the memory device.

In some implementations, the ARL information includes: first parameter data of at least one first parameter associated with the at least one block or ARL data for the at least one block. In some examples, the at least one first parameter includes at least one of retention time, erase cycle count, read disturbance count, or write temperature, and the first parameter data includes at least one respective value of the at least one first parameter for the at least one block. The ARL data for the at least one block can include at least one read voltage offset for the at least one block.

In some implementations, the method further includes: in response to determining that the ARL information includes the first parameter data, setting a control flag in the memory device to indicate the ARL determination based on the first parameter data by the memory device. Storing the ARL information in the memory device can include: storing the first parameter data in a first internal memory in the memory device.

In some implementations, determining at least one adjusted read voltage for the at least one block by the memory device includes: in response to determining that the control flag indicates the ARL determination based on the first parameter data, determining the at least one adjusted read voltage based on the first parameter data stored in the first internal memory and second parameter data of at least one second parameter in the memory device, and the second parameter data is generated for the at least one block based on the read command by the memory device.

In some examples, the at least one second parameter includes at least one of a block physical location in the memory device, a page physical location in the memory device, or an internal temperature of the memory device, and the second parameter data includes at least one respective value for the at least one second parameter.

In some implementations, the method further includes: measuring the internal temperature by a temperature sensor in the memory device.

In some implementations, the method further includes: determining, for each read voltage of the at least one block, a respective predefined offset for each parameter of the at least one first parameter and the at least one second parameter based on the first parameter data and the second parameter data by the memory device, and determining at least one adjusted read voltage for the at least one block by the memory device can include: determining a corresponding adjusted read voltage for the at least one block based on the read voltage and the respective predefined offsets of the at least one first parameter and the at least one second parameter for the read voltage. The corresponding adjusted read voltage can be identical to a sum of the read voltage and the respective predefined offsets for the read voltage.

In some implementations, the method further includes: maintaining, for each parameter of the at least one first parameter and the at least one second parameter, a respective table associating predefined offsets with corresponding values of the parameter by the memory device.

In some implementations, the method further includes: in response to determining that the ARL information include the ARL data, setting a control flag in the memory device to indicate the ARL determination based on the ARL data by the memory device. Storing the ARL information in the memory can include: storing the ARL data in a second internal memory in the memory device.

In some implementations, determining the at least one adjusted read voltage based on the stored ARL information in the memory includes: determining the at least one adjusted read voltage based on the ARL data stored in the second internal memory.

In some examples, the ARL data for the at least one block includes at least one read voltage offset for at least one read voltage of the at least one block, and each adjusted read voltage is identical to a sum of a read voltage and a corresponding read voltage offset.

In some examples, the specified command includes a command cycle code, an address cycle code, and at least one data cycle code, and the ARL information is included in the at least one data cycle code.

In some implementations, the memory device includes multiple planes, and at least one of the command cycle code or the address cycle code is configured to select a single plane for a single plane operation or an individual plane for a multi-plane operation.

In some implementations, the read command includes a prefix cycle code and a command cycle code, and one of the prefix cycle code and the command cycle code is configured to include the indication for enabling the ARL determination.

In some implementations, the memory device includes multiple planes each having a plurality of blocks, the read operation is a multi-plane operation, and the at least one block includes a respective block in each plane of the planes. Determining at least one adjusted read voltage for the at least one block by the memory device can include: determining, for each of the respective blocks in the planes, a different corresponding adjusted read voltage by the memory device.

In some implementations, the method further includes: sequentially receiving a respective specified command for each plane of the planes by the memory device, the respective specified command including corresponding ARL information for determining the different corresponding adjusted read voltage for the respective block in the plane; sequentially receiving a respective read command for each plane of the planes by the memory device; determining, for each of the respective blocks in the planes, the different corresponding adjusted read voltage based on the corresponding ARL information and the respective read command by the memory device; executing the multi-plane operation based on the corresponding adjusted read voltages for the respective blocks in the planes according to the respective read commands by the memory device; and sequentially outputting respective memory data read from each of the respective blocks in the planes to the memory controller by the memory device.

Implementations of the above techniques include methods, systems, computer program products and computer-readable media. In one example, a method can be performed by a memory controller coupled to a non-volatile memory and the method can include the above-described actions performed by the memory controller, e.g., the actions for managing memory reliability in the non-volatile memory. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

Implementations of the present disclosure provide systems and methods for managing memory reliability in memory systems, which can provide adjusted read levels (e.g., adjusted read voltage levels) for memory blocks/pages having data integrity or reliability issues. The techniques can be implemented for any type of memories suffering from read disturbance, data retention, and/or other disturbance effects. Besides blocks, the techniques can be implemented for sub-blocks within a block, which can better manage the block. The techniques can also be implemented for super blocks (or striped-blocks) that each combine multiple blocks from different planes, where the multiple blocks suffer from reliability issues due to same read/erase/write operations. The techniques can be implemented for single plane operations or multi-plane operations. The techniques can be implemented for any type of controller to set parameters, types, or values to adjust voltage or current levels in a device. The parameters can be implemented in one or more commands to be provided to the device.

The techniques can be applied to various types of volatile memory devices or non-volatile memory devices, such as NAND flash memory, NOR flash memory, resistive random-access memory (RRAM), phase-change random-access memory (PCRAM), among others. The techniques can be applied to two-dimensional (2D) memory devices or three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), universal flash storages (UFSs), solid-state drives (SSDs), embedded systems, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 3 illustrates an example of a parameter table in a memory controller, according to one or more implementations of the present disclosure.

FIGS. 8A-8B illustrate an example of an ARL calculation module in an ARL unit, according to one or more implementations of the present disclosure.

DETAILED DESCRIPTION

Figure 1A:
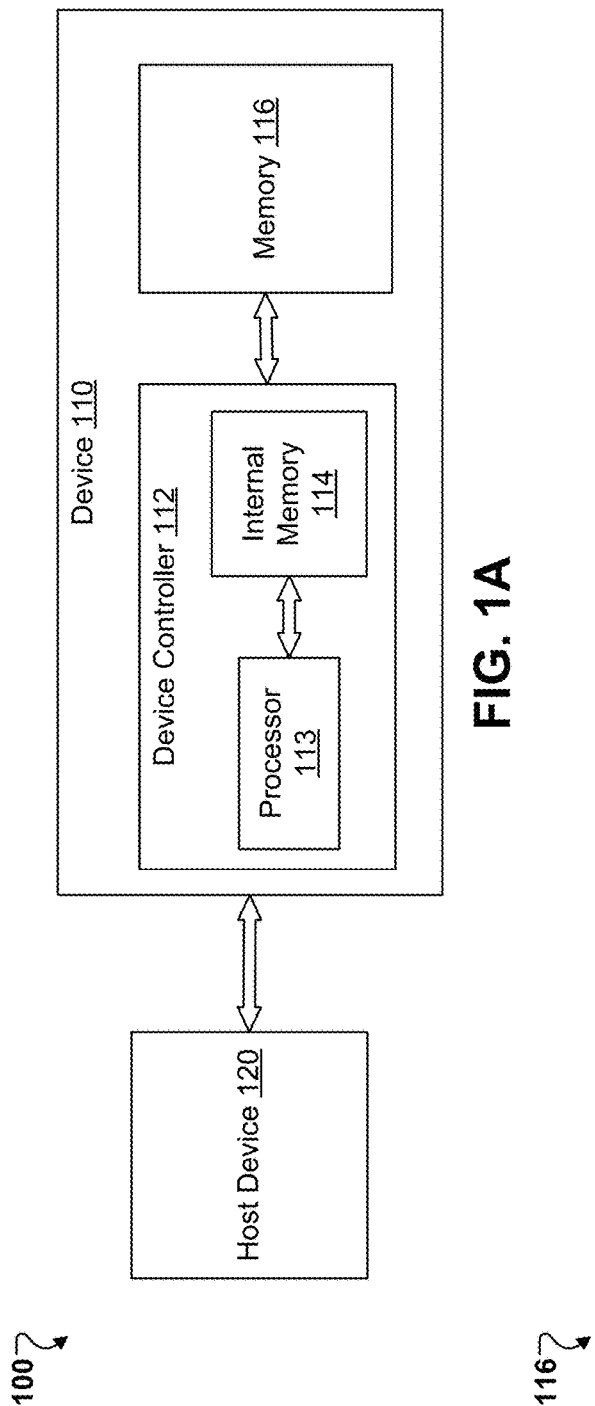
FIG. 1A illustrates an example of a system, according to one or more implementations of the present disclosure.

Data stored in memory cells of a memory device may suffer from reliability issues, which may cause states of the data to vary with changed threshold voltages. The changed threshold voltages may cause failed bits in read operations. When a number of failed bits increases, error bit correction, e.g., by a low-density parity check code (LDPC) module, may need more iteration time, which may lower a performance of the memory device.

The memory reliability can be affected by a number of parameters associated with the memory device, including retention time, write temperature, internal temperature, erase cycle count, block/page physical location, and/or read disturbance count. For example, retention time represents stored time of data. The longer the retention time, the more serious the reliability issue can be. Write temperature represents the temperature when data is written in the memory. The higher the write temperature, the more serious the reliability issue can be. Internal temperature represents a current temperature in the memory device. The higher the internal temperature, the more serious the reliability issue can be. Erase cycle count represents a number of times a block has been erased. The larger the erase cycle count, the more serious the reliability issue can be. A block/page physical location represents a physical location of a block or page where the data is stored. The data stored in an edge of the memory device suffers from more serious reliability issue than that stored in a center of the memory device. A read disturbance count represents a number of times a block has been read. The larger the read disturbance count, the more serious the reliability issue can be.

The memory device can include multiple planes each having a number of blocks. In some cases, a single plane operation may be executed, where a read command may read out data in multiple blocks in the single plane. However, different blocks in the single plane may have different characteristics and thus different reliabilities. In some cases, a multi-plane operation may be executed in the memory device. For example, a read command may read block 436 in plane 0, block 1 in plane 2, block 250 in plane 3, and block 999 in plane 4 at the same time. Read voltages applied on selected word lines in these selected blocks in the multiple planes may be same. However, different blocks may have different characteristics and thus different reliabilities or different threshold voltages for memory cells. Therefore, it is highly desirable to individually adjust read voltage levels in the single plane operation and the multi-plane operation.

Implementations of the present disclosure provide systems, devices, methods and techniques for managing memory reliability in memory systems, e.g., non-volatile memory systems such as NAND flash memories. In particular, the techniques enable memory devices to provide adjusted read levels (ARLs) (or adjusted read voltage levels) to address memory reliability issues in the memory systems. A memory system can include a memory controller and a memory device. The memory controller can store, e.g., in a parameter table, one or more external parameters that may impact reliability of the memory device, e.g., retention time, erase cycle count, read disturbance count, and/or write temperature. The memory device can also generate or store, e.g., in an internal parameter unit, one or more internal parameters that may impact the reliability of the memory device, e.g., a block physical location, a page physical location, and/or an internal temperature. The memory device can include a temperature sensor to detect the internal temperature. The memory controller can send the one or more external parameters stored in the memory controller to the memory device, e.g., by specified commands, before the memory device executes a read operation. The memory device can calculate adjusted read levels for blocks/pages in the memory device by using the one or more external parameters from the memory controller and the one or more internal parameters from the memory device itself. In a read operation across multiple planes in the memory device (or a multi-plane operation), the memory device can individually provide a respective adjusted read level for each of the multiple planes.

In some implementations, the memory device includes an adjusted read level (ARL) unit. The ARL unit can be implemented by logic circuits, program instructions, or a combination thereof. The ARL unit can be included in a control logic (or an internal controller) of the memory device. The internal parameter unit can be also included in the control logic. In some cases, the ARL unit is included in the memory device but is external to the control logic. In some cases, the ARL unit is included in the memory controller. The ARL unit can be configured to operate an algorithm (e.g., a formula) based on parameters, e.g., the internal parameters from the internal parameter unit and/or the external parameters from the memory controllers, to determine one or more suitable adjusted read levels, e.g., automatically when receiving a read command from the memory controller.

In some implementations, the memory device is configured to enable the ARL unit when executing a read command. The memory device can use a specified command, a specified command sequence, or a prefixed command in an extra command cycle, to select suitable ARL values. The memory device can also use a specified command or a specified command sequence to receive ARL parameters or ARL values from the memory controller. The techniques can support single plane operation. The techniques can also support multi-plane operations. The techniques can provide different adjusted read levels to different planes. For example, in a multi-plane operation, the memory device (e.g., the ARL unit) can provide a read level of 5.8 V to plane 0, a read level of 5.7 V to plane 1, a read level of 5.9 V to plane 2, and a read level of 5.6 V to plane 3.

FIG. 1A illustrates an example of a system 100 that includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specified microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specified microcontroller. The processor 113 can be also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. For illustration purposes only, the following description uses a NAND flash memory as an example of the memory 116.

As discussed in further details below, the device controller 112 can include a parameter table recording external parameters, e.g., data retention time, erase cycle count, read disturbance count, and/or write temperature, that may impact reliability of the memory 116. The memory 116 can include an internal parameter unit storing internal parameters, e.g., a block physical location, a page physical location, and/or internal temperature, that may impact the reliability of the memory 116. The memory 116 can also include an adjusted read level (ARL) unit, e.g., in a control logic, configured to calculate or adjust read voltage levels based on the external parameters from the parameter table in the device controller 112 and the internal parameters from the internal parameter unit in the memory 116, e.g., automatically when performing a read command. The adjusted read voltage levels can be used for single plane operation or multi-plane operations.

Figure 1B:
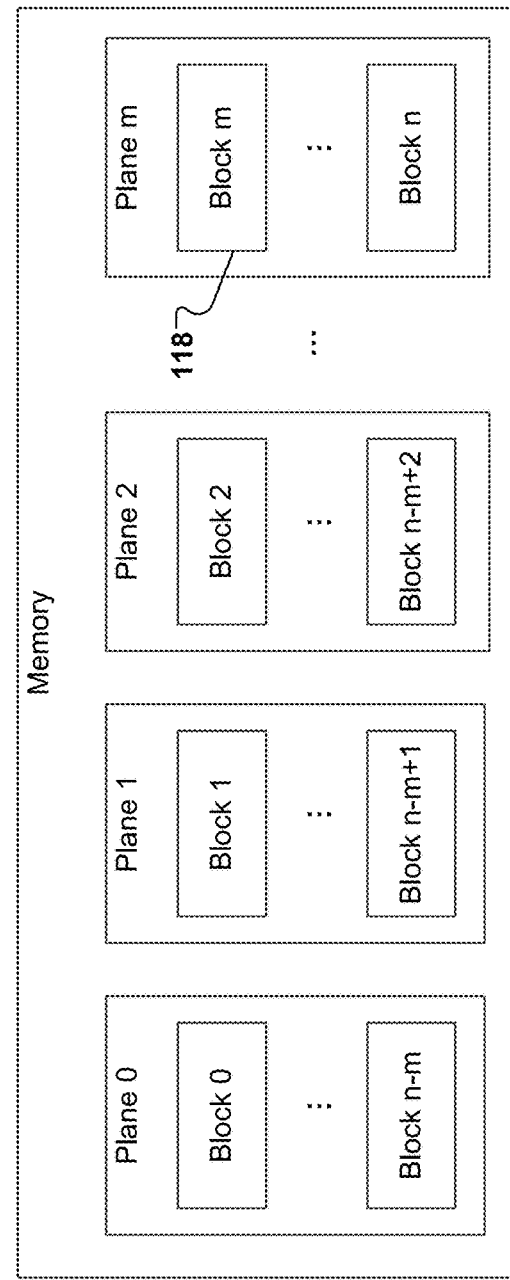
FIG. 1B illustrates an example memory including multiple planes, according to one or more implementations of the present disclosure.

FIG. 1B illustrates an example configuration of the memory 116 that includes a plurality of planes, e.g., Plane 0, Plane 1, Plane 2, . . . , Plane m, where m is an integer. The planes can include a plurality of physical blocks 118, e.g., Block 0, Block 1, . . . , and Block n. Each block can include a same number of pages. Each page has a unique number in the block. Data can be stored in the pages of the block according to the order of the unique numbers of the pages in the block. Each page can be read or written separately, and pages in a block can be erased together.

In some implementations, the plurality of planes is included in a die. The die can be a memory chip that includes the planes and peripheral circuitry thereon. In some implementations, the memory 116 includes two or more dies. A multi-plane operation can be executed among multiple planes in a same die.

Figure 1C:
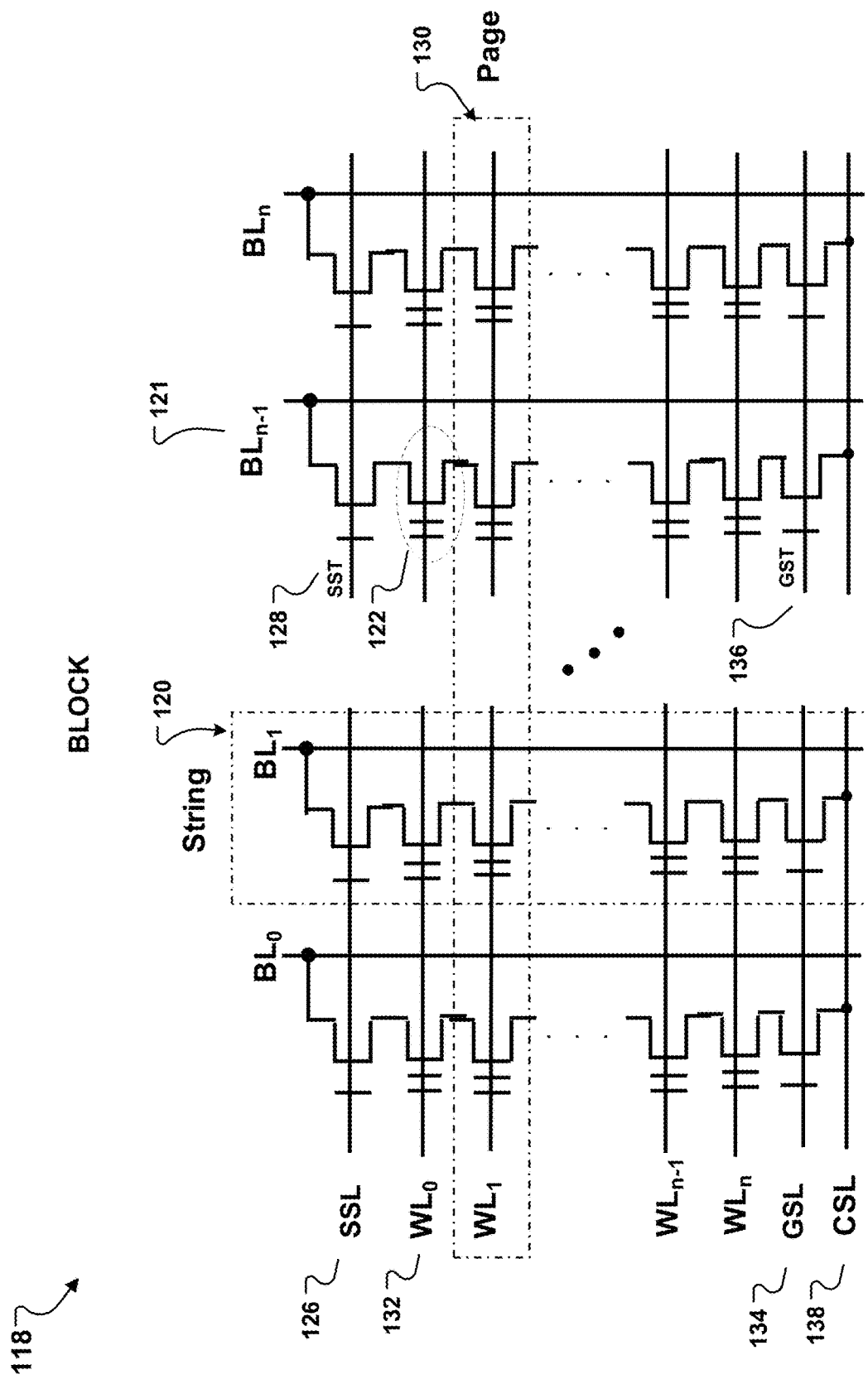
FIG. 1C illustrates an example block in a memory, according to one or more implementations of the present disclosure.

FIG. 1C illustrates an example configuration of a block 118, e.g., a two-dimensional (2D) memory block, of the memory 116. The memory block 118 includes memory cells 122 that are coupled in series to column bit lines $BL_0$, $BL_1$, . . . , $BL_{n-1}$, and $BL_n$ to form a number of strings 120, and to row word lines $WL_0$, $WL_1$, . . . , $WL_{n-1}$, and $WL_n$ to form a number of pages 130.

Each memory cell is coupled to a row decoder via a respective word line 132 and coupled to a column decoder via a respective bit line 121. Accordingly, each memory cell can be selected for operation through the respective word line 132 and the respective bit line 121. A control logic is connected to the row decoder and the column decoder, e.g., via global word lines and global bit lines, and configured to control the memory cells 122 through the row decoder and the column decoder. The control logic can be configured to receive commands and/or data signal from the device controller 112.

A string 120 can include a number of memory cells 122, a source select transistor (SST) 128, and a ground select transistor (GST) 136, which are all connected in series. A gate of the SST 128 is connected to a source select line (SSL) 126. Gates of the SSTs in different strings are also connected to the same SSL. Gates of the memory cells 122 are respectively connected to word lines $WL_0$, $WL_1$, . . . , $WL_{n-1}$, $WL_n$. The memory cells 122 are connected to a common source line (CSL) 138 via the GST 136. A gate of the GST 136 is connected to a ground select line (GSL) 134. Gates of the GSTs in different strings are also connected to the same GSL. The GST 136 and the SST 128 can be metal-oxide-semiconductor (MOS) transistors, and the memory cells 122 can be floating gate transistors.

A page 130 can include a number of memory cells 122. Gates of the memory cells 122 in the page 130 are coupled in series to a respective word line (WL). When an input voltage is applied to the word line, the input voltage is also applied to all the gates of the memory cells 122 in the page 130.

A memory cell can represent a number of states including an erased state and one or more programmed states. For example, in some cases, the memory cell is a single-level cell (SLC) that can store 1 bit and represent two states including an erased state (ER) and a programmed state (A). Memory cells in one word line can form one page. In some cases, the memory cell is a multi-level cell (MLC) such as a 2-level cell that can store 2 bits and represent 4 states including an erased state (ER) and three programmed states (A, B, and C). Memory cells in one word line can form two pages. In some cases, the memory cell is a triple-level cell (TLC) that can store 3 bits and represent 8 states including an erased state (ER) and seven programmed states (A, B, C, D, E, F, and G). Memory cells in one word line can form three pages.

Figure 4:
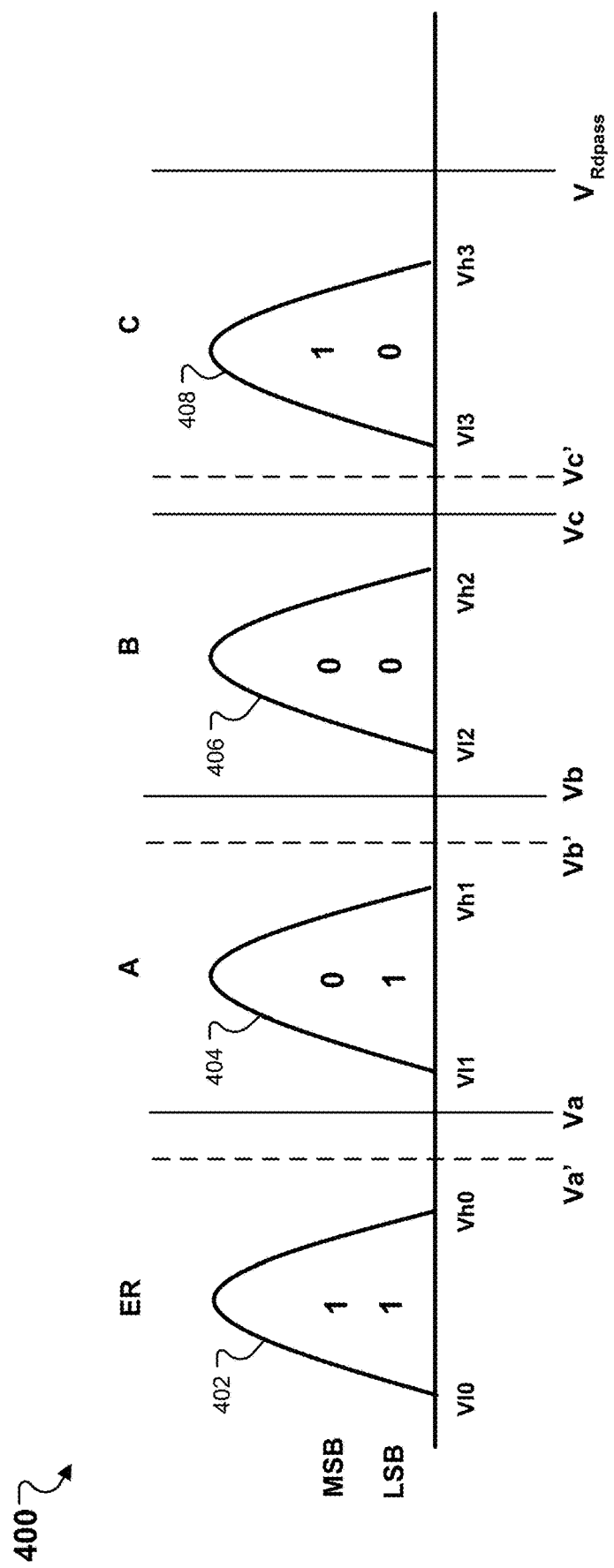
FIG. 4 illustrates an example of adjusted read voltage levels for memory cells in different states, according to one or more implementations of the present disclosure.

As illustrated with further details in FIG. 4, the states of the memory cells can have progressively higher threshold voltage ranges, and the erased state can have the lowest threshold voltage range. The threshold voltage ranges can be changed (e.g., increased or decreased) due to reliability issues. As noted above, the reliability issues can be impacted by data retention time, erase cycle count, read disturbance count, write temperature, block/page physical location, and/or internal temperature. During a read operation, a read voltage is applied to a word line coupled to a gate of a selected memory cell to determine whether the selected memory cell is turned on or off. If a threshold voltage range of the state of the selected memory cell is changed, the read voltage applied to the word line may also need to be changed or adjusted to avoid a read error.

Figure 2A:
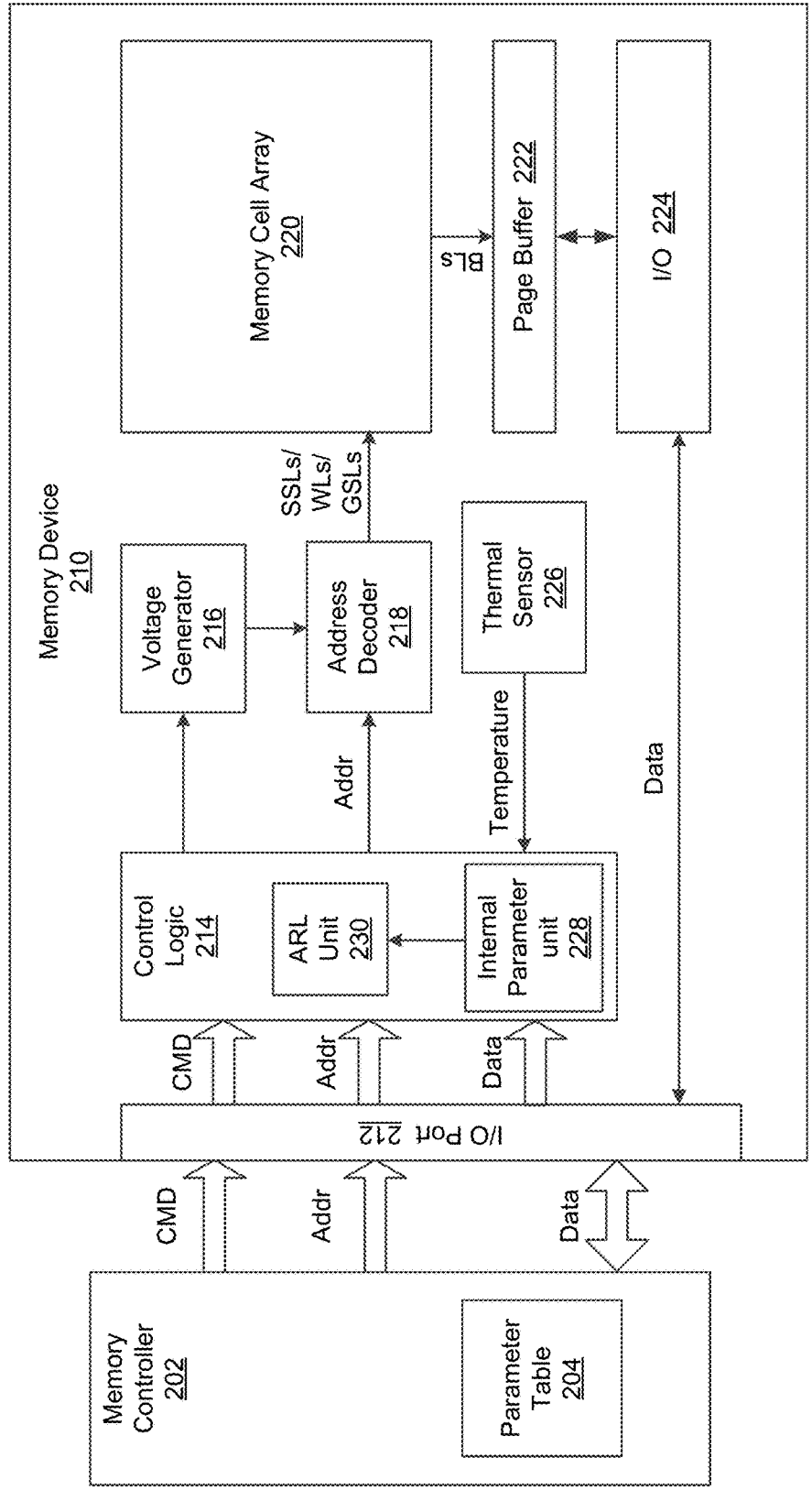
FIG. 2A illustrates an example of a memory system, according to one or more implementations of the present disclosure.

FIG. 2A illustrates an example of a memory system 200, according to one or more implementations of the present disclosure. The memory system 200 includes a memory controller 202, e.g., the device controller 112 of FIG. 1A, and a memory device 210, e.g., the memory 116 of FIGS. 1A-1B. The memory system 200 is configured to address reliability issues in the memory device 210, e.g., by providing adjusted read levels to different planes, different blocks, or different pages in the memory device 210, which can avoid read errors, reduce error corrections, and improve a performance of the memory system 200.

The memory device 210 can be formed in a die that can be a memory chip including multiple planes and peripheral circuitry thereon. The memory device 210 can include a memory interface, e.g., an I/O (input/output) port 212, having multiple pins. In some examples, the I/O port 212 includes SI/SIO0 for serial data input/serial data input & output, SO/SIO1 for serial data output/serial data input & output, SIO2 for serial data input or output, WP #for write protection active low, Hold #for a holding signal input, RESET #for hardware reset pin active low, and CS #for chip select.

The memory device 210 is configured to communicate with the memory controller 202 via the I/O port 212. For example, the memory controller 202 can transmit a command (CMD) or address (Addr) information to the memory device 210. The memory controller 202 can also write data into the memory device 210 or read data from the memory device 210. In some examples, the memory controller 202 includes a flash controller for communicating with the memory device 210. In some examples, the memory controller 202 includes an interface for communicating with a host device, e.g., the host device 120 of FIG. 1A. The memory controller 202 can communicate with the host device through a flash transition layer (FTL). In some implementations, the memory system 200 includes the memory controller 202 and a plurality of memories including the memory device 210. The memory controller 202 is configured to be in communication with the plurality of memory devices.

As illustrated in FIG. 2A, the memory device 210 includes a memory cell array 220. The memory cell array 220 includes a number of memory cells coupled in series to a number of row word lines, e.g., the word lines 132 of FIG. 1C, and a number of column bit lines, e.g., the bit lines 121 of FIG. 1C. A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory MOS device that can store charges.

The memory device 210 further includes an address decoder 218 that can include an X-decoder (or row decoder) and a Y-decoder (or column decoder). Each memory cell is coupled to the X-decoder via a respective word line and coupled to the Y-decoder via a respective bit line. Accordingly, each memory cell can be selected by the address decoder 218 (the X-decoder and the Y-decoder) for read or write operations through the respective word line and the respective bit line.

The memory device 210 includes a control logic (or an internal controller) 214. The control logic 214 is configured to receive a command, address information, and/or data, from the memory controller 202 via the IP port 212. The control logic 214 can also communicate with one or more other components in the memory device 210, e.g., the address decoder 218 and a voltage generator 216. For example, the control logic 214 can process the command, the address information, and/or the data to generate voltage information for the memory cell array 220 that is output to the voltage generator 216. The voltage generator 216 can generate one or more corresponding voltages based on the voltage information and provide the generated voltages to the memory cell array 220 through the address decoder 218.

The control logic 214 can also process the command, address information, and/or the data, for example, to generate physical address information, e.g., of blocks/pages, in the memory cell array 220. The address decoder 218 can obtain the physical address information from the control logic 214 and select corresponding memory cells in the memory cell array 220. The address decoder 218 can also provide one or more corresponding voltages generated by the voltage generator 216 to the memory cell arrays 220 to SSLs (e.g., the SSL 126 of FIG. 1C), WLs (e.g., the WL 132 of FIG. 1C), and/or GSLs (e.g., the GSL 134 of FIG. 1C).

In some implementations, the control logic 214 includes a data register, an SRAM buffer, an address generator, a mode logic, and a state machine. The mode logic can be configured to determine whether there is a read or write operation and provide a result of the determination to the state machine. The memory device 210 can also include a sensor amplifier that is connected to the address decoder 218, e.g., to the Y-decoder by a data line. The memory device 210 can also include a page buffer 222 for buffering an output signal or data from the memory cell array 220 through an I/O port 224 to the I/O port 212, or for buffering input data from the memory controller 202 to the memory cell array 220 through the I/O port 212 and the I/O port 224.

During a write operation, the data register in the control logic 214 can register input data from the I/O port 212, and the address generator in the control logic 214 can generate corresponding physical addresses to store the input data in specified memory cells of the memory cell array 220. The address generator can be connected to the address decoder 218 (the X-decoder and Y-decoder) that are controlled to select the specified memory cells through corresponding word lines and bit lines. The SRAM buffer can retain the input data from the data register in its memory as long as power is being supplied. The state machine can process a write signal from the SRAM buffer and provide a control signal to the voltage generator 216 that can generate a write voltage and provides the write voltage to address decoder 218 (the X-decoder and the Y-decoder). The Y-decoder is configured to output the write voltage to the bit lines (BLs) for storing the input data in the specified memory cells.

During a read operation, the state machine can provide control signals to the voltage generator 216 and the sense amplifier. The voltage generator 216 can provide a read voltage to the address decoder 218 (the X-decoder and the Y-decoder) for selecting a memory cell. The sense amplifier can sense a small power (voltage or current) signal from a bit line that represents a data bit (1 or 0) stored in the selected memory cell and amplify the small power signal swing to recognizable logic levels so the data bit can be interpreted properly by logic outside the memory device 210. The page buffer 222 can receive the amplified voltage from the sensor amplifier and output the amplified power signal to the logic outside the memory device 210 through the I/O 224 and the I/O port 212.

States of memory cells in the memory cell array 220 can have progressively higher threshold voltage ranges. FIG. 4 illustrates an example 400 of threshold voltage distributions and read voltages for different states of a memory cell of a memory, according to one or more implementations. The memory cell can be the memory cell 122 of FIG. 1C. The memory can be aNAND flash memory. For illustration, the memory cell is an MLC capable of storing two-bit data. The memory cell can be programmed or erased to have any one of four states ER, A, B, and C. In some examples, ER is an erased state (1,1), and A, B, C are programmed states (0, 1), (0, 0), and (1, 0). The states ER, A, B and C have progressively higher read voltages. The MLC NAND flash memory can partition the two bits of each memory cell in a word line across two pages, which are the unit of data programmed at a time. The least significant bits (LSBs) of all memory cells in one word line form the LSB page of the word line, and the most significant bits (MSBs) of these cells on the word line form the MSB page of the word line.

Once programmed or erased, the memory cell has a corresponding threshold voltage. The threshold voltage is a characteristic of the memory cell. The memory cell can be a floating gate transistor. When a read voltage higher than or identical to the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Each state corresponds to a distribution of threshold voltages in a range between a lower limit voltage and a higher limit voltage. A memory cell having a threshold voltage within the range is considered to be in the corresponding state. In other words, a memory cell being in a state has a threshold voltage within the range. For example, if the memory cell has a threshold voltage between Vl0 and Vh0, the memory cell is in the state ER; if the memory cell has a threshold voltage between Vl1 and Vh1, the memory cell is in the state A; if the memory cell has a threshold voltage between Vl2 and Vh2, the memory cell is in the state B; and if the memory cell has a threshold voltage between Vl3 and Vh3, the memory cell is in the state C. Curves 402, 404, 406, 408 show threshold voltage distributions of the respective states ER, A, B, C of the memory cell, respectively.

During a read operation, a read voltage can be applied to a word line coupled to agate of a selected memory cell to determine whether the selected memory cell is a turned-on or turned-off state. When a read voltage $V_a$ that is larger than the threshold voltage of ER but smaller than the threshold voltage of A is applied, the memory cell is turned on when it has the state ER and turned off when it has the state A, B, or C; when a read voltage $V_b$ that is larger than the threshold voltage of A but smaller than the threshold voltage of B is applied, the memory cell is turned on when it has the state ER or A and turned off when it has the state B or C; when a read voltage $V_c$ that is larger than the threshold voltage of B but smaller than the threshold voltage of C is applied, the memory cell is turned on if it has the state ER, A, or B and off when it has the state C. When the read voltage $V_{Rdpass}$ that is larger than all the threshold voltages of the states ER, A, B, C is applied, the memory cell is turned on regardless of whatever state the memory cell had.

During the read operations, other memory cells in the same bit line as the selected memory cell are applied with a pass voltage $V_{Rdpass}$ and are turned on. Thus, if the selected memory cell is turned on under a read voltage, the memory cells in the corresponding bit line form a conductive path, and there will be a current or a voltage change, which can be detected by a current or voltage sensor coupled to the bit line. If the selected memory cell is turned off under the read voltage, the memory cells in the corresponding bit line does not form a conductive path, and there is no current or no voltage change, which can be detected by a current or voltage sensor coupled to the bit line.

As noted above, due to reliability issues, threshold voltage ranges of memory cells in a memory can be changed. If a read voltage applied to a word line is kept constant, a state of a selected memory cell may be wrongly determined, which causes a failed bit or error bit. In contrast, if the read voltage applied to the word line can be adjusted to a proper value to address the reliability issues, a read error can be avoided.

In some implementations, as illustrated in FIG. 2A, the memory device 210 includes an adjusted read level (ARL) unit 230. The ARL unit 230 can be included in the control logic 214. The ARL unit 230 can be also external to the control logic 214 but in the memory device 210. The ARL unit can be implemented by logic circuits, program instructions, or a combination thereof. The ARL unit 230 is configured to provide corresponding adjusted read voltage levels for different pages (or word lines) of blocks, e.g., automatically when receiving read commands. For example, as illustrated in FIG. 4, Va, Vb, Vc are original read voltage levels for reading an MLC page, and Va', Vb', Vc' are adjusted read voltage levels for reading the MLC page, where Va' is smaller than Va, Vb' is smaller than Vb, and Vc' is larger than Vc. The ARL unit 230 can be used for single-plane operations or multi-plane operations.

Figure 5:
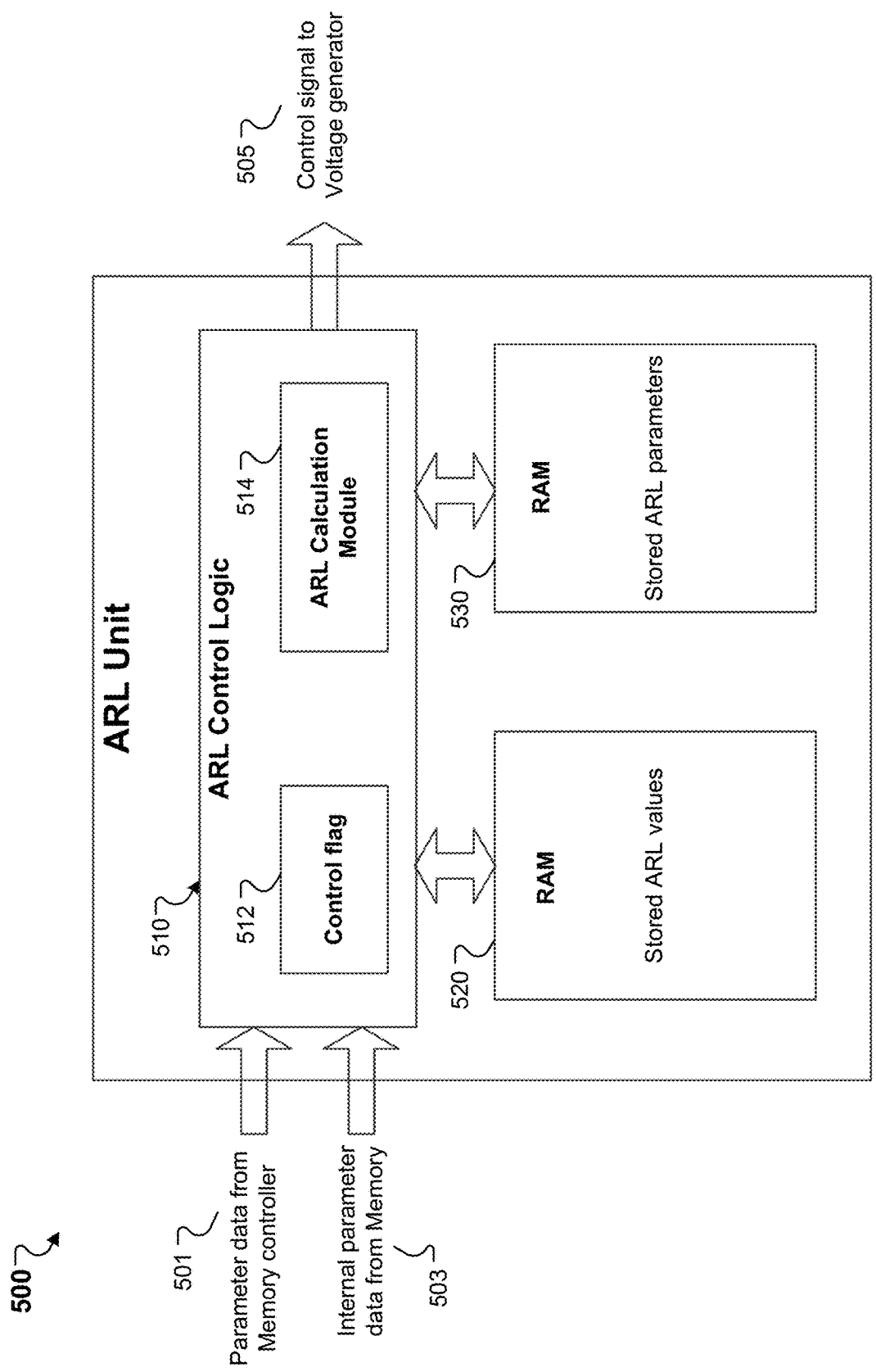
FIG. 5 illustrates an example of an adjusted read level (ARL) unit, according to one or more implementations of the present disclosure.
Figure 6A:
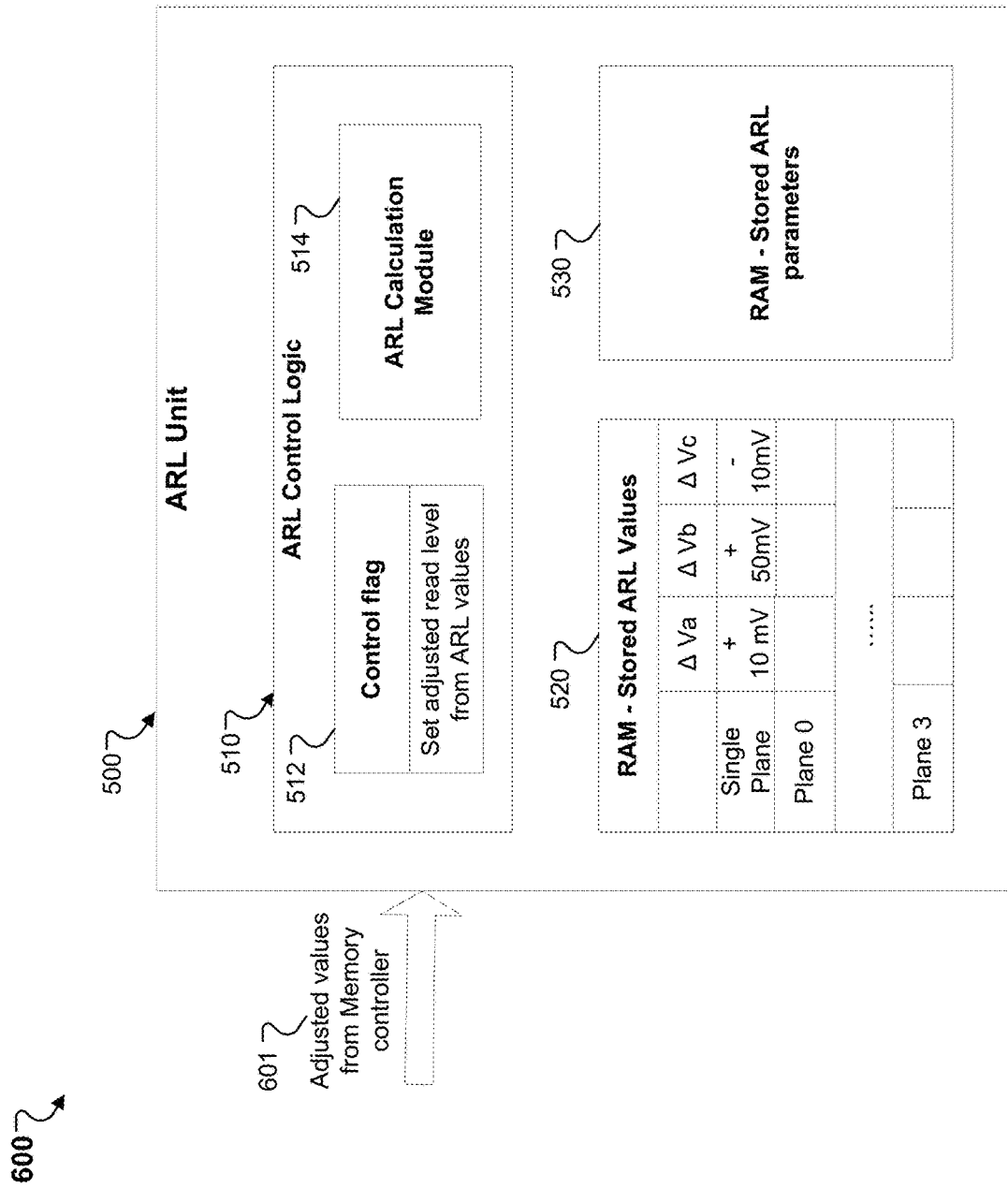
FIGS. 6A-6B illustrate an example of operating an ARL unit in response to receiving adjusted ARL values from a memory controller, according to one or more implementations of the present disclosure.
Figure 6B:
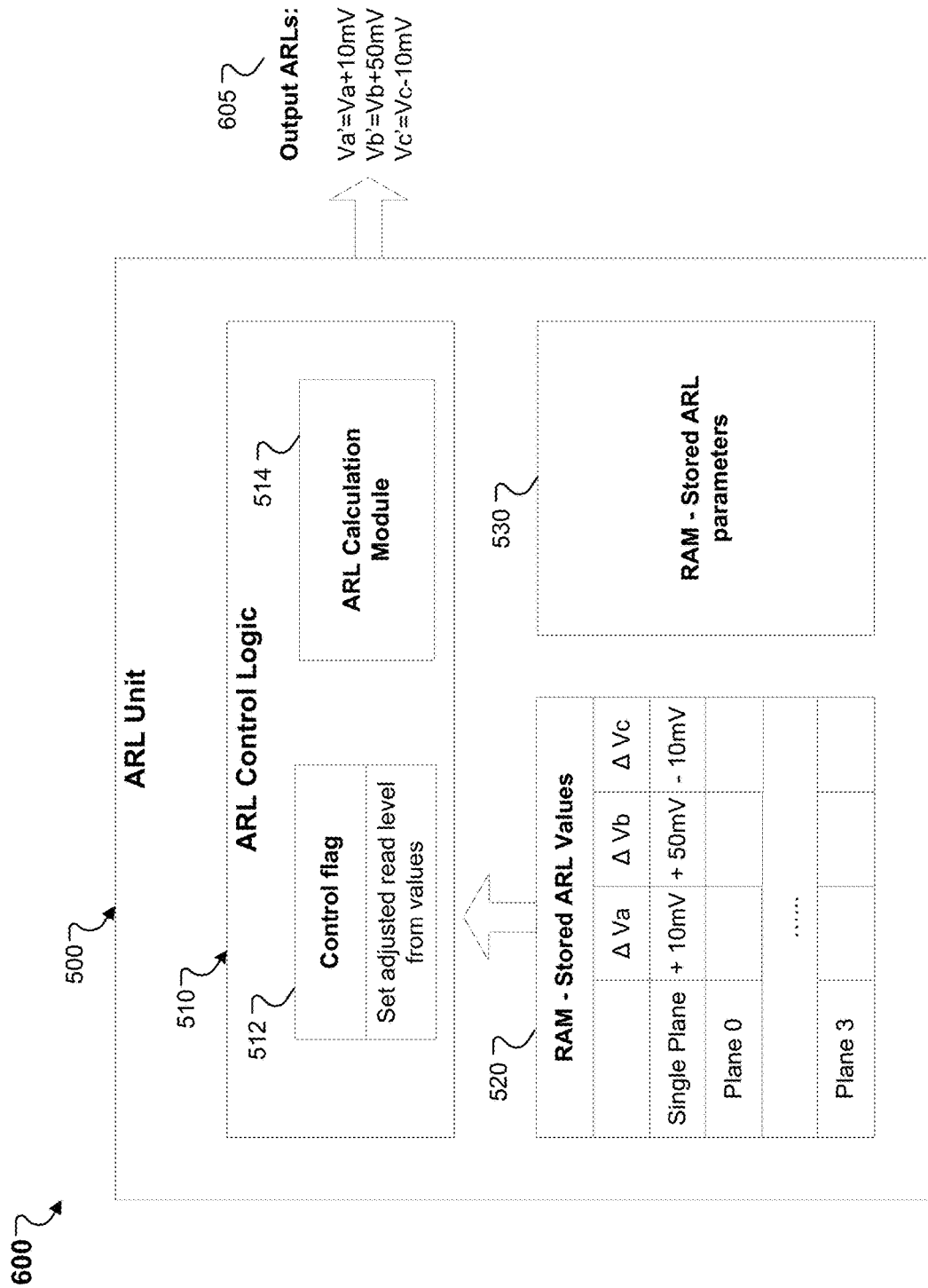
Figure 7A:
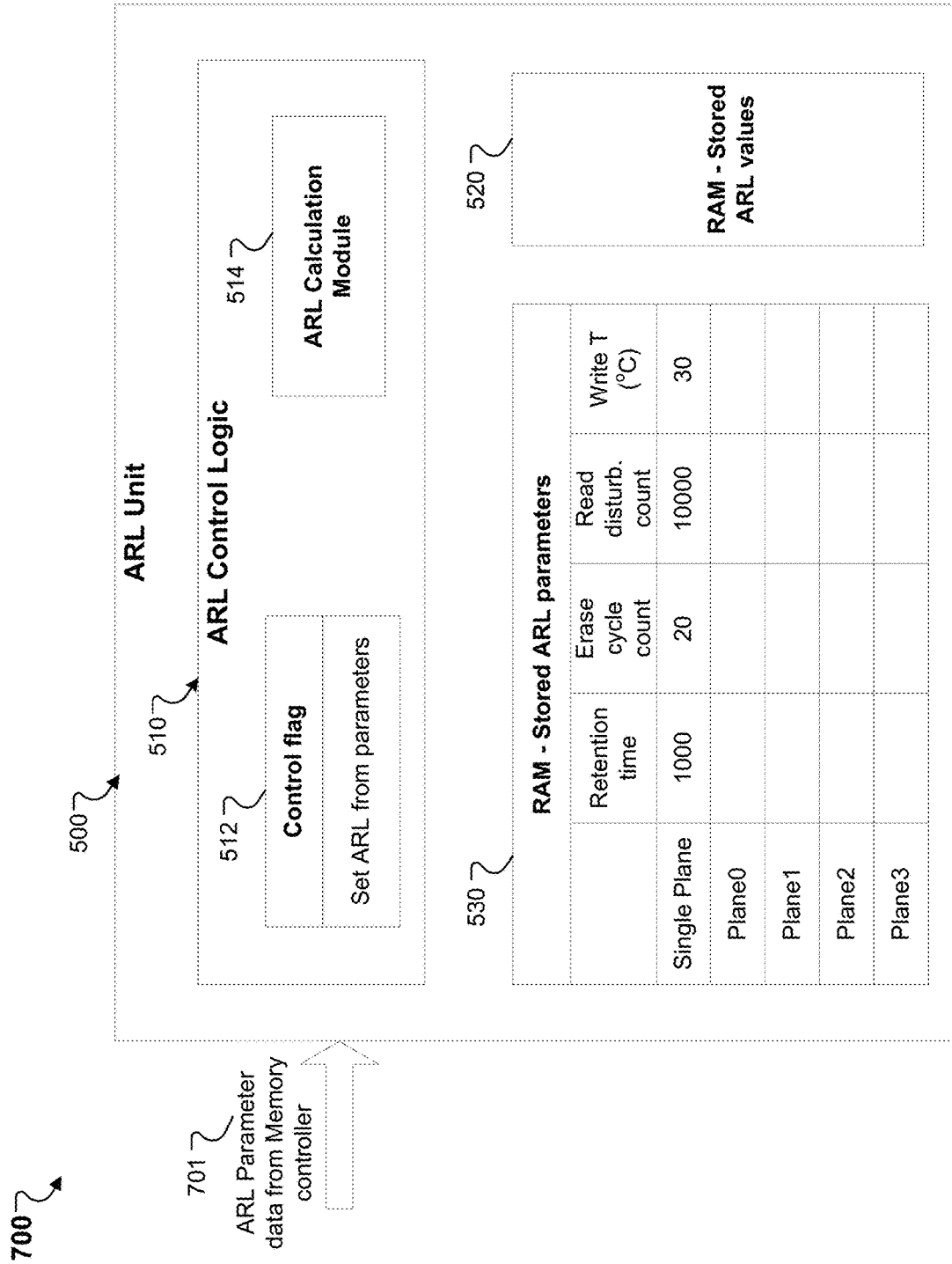
FIGS. 7A-7B illustrates an example of operating an ARL unit in response to receiving ARL parameters from a memory controller, according to one or more implementations of the present disclosure.
Figure 7B:
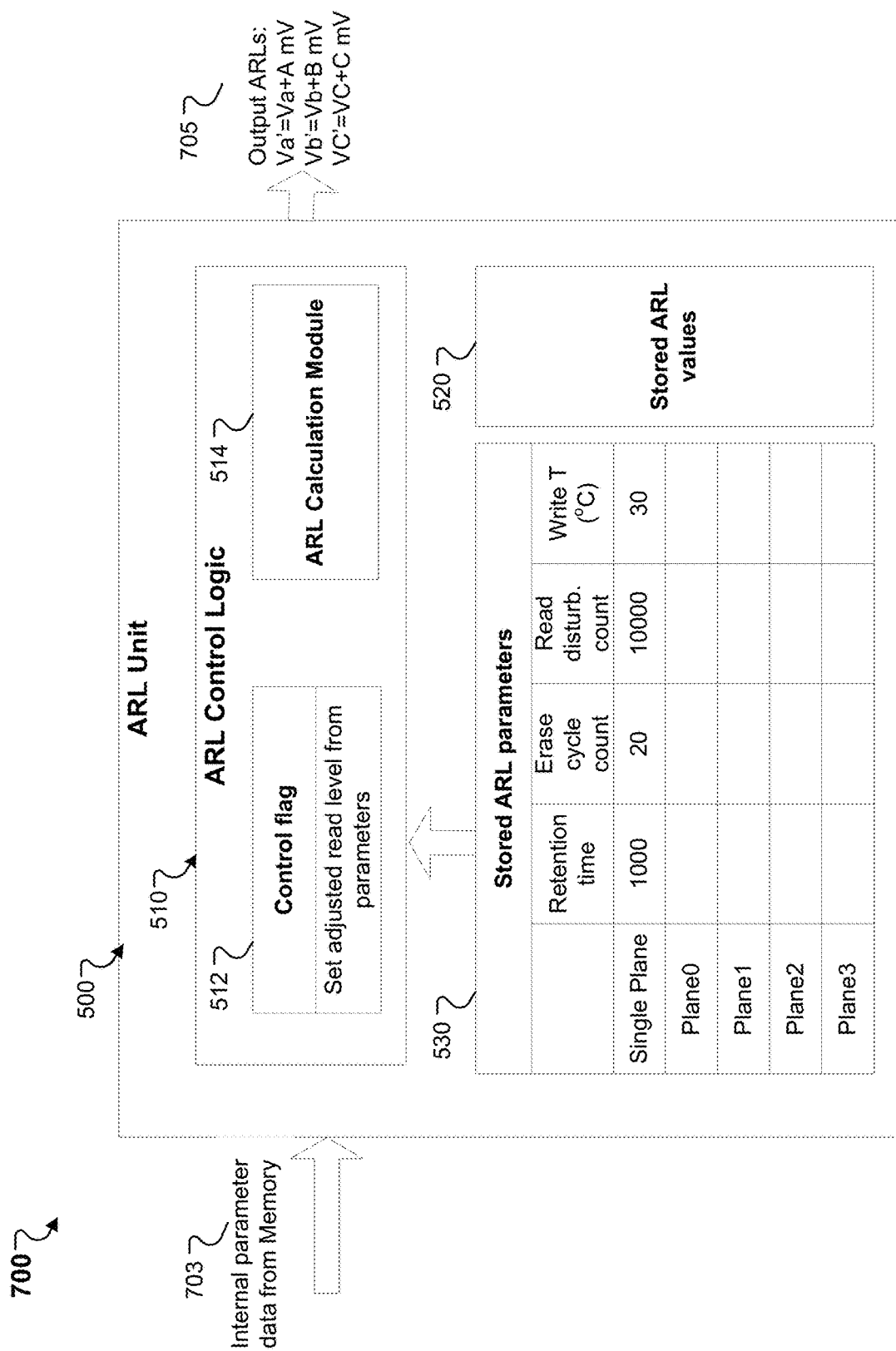

As described with further details below, the ARL unit 230 can determine adjusted read voltage levels, e.g., according to an algorithm or formula, based on parameters from the memory controller 202 and/or internal parameters from the memory device 210 itself, e.g., as illustrated in FIG. 5. The ARL unit 230 can also use ARL values from the memory controller 202 for generating corresponding read voltages, e.g., as illustrated in FIGS. 6A-6B. The ARL unit 230 can also calculate adjusted read levels based on ARL parameters from the memory controller 202, e.g., as illustrated in FIGS. 7A-7B.

Figure 9A:
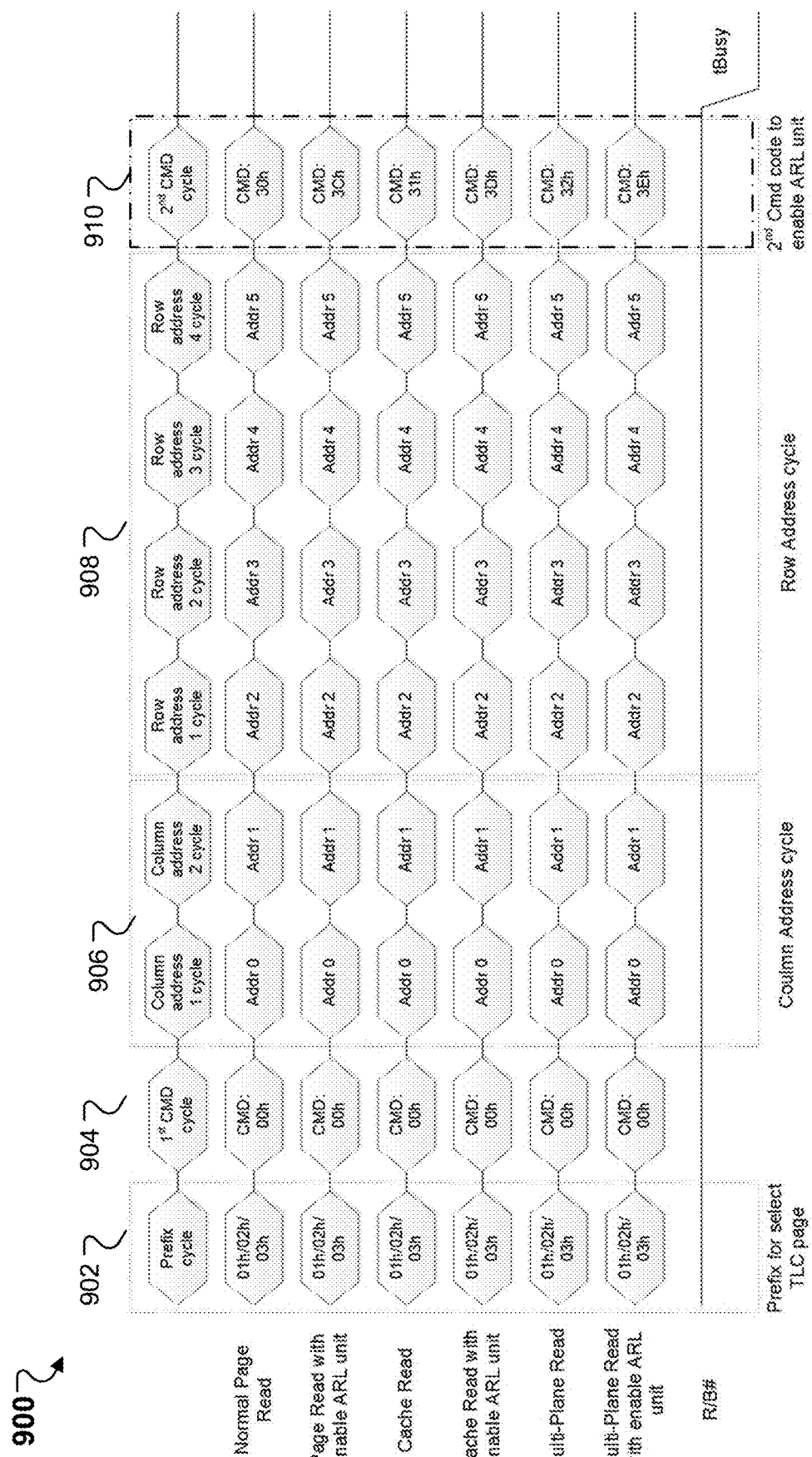
FIG. 9A illustrates an example of enabling an ARL unit with read operation using different command codes, according to one or more implementations of the present disclosure.
Figure 9B:
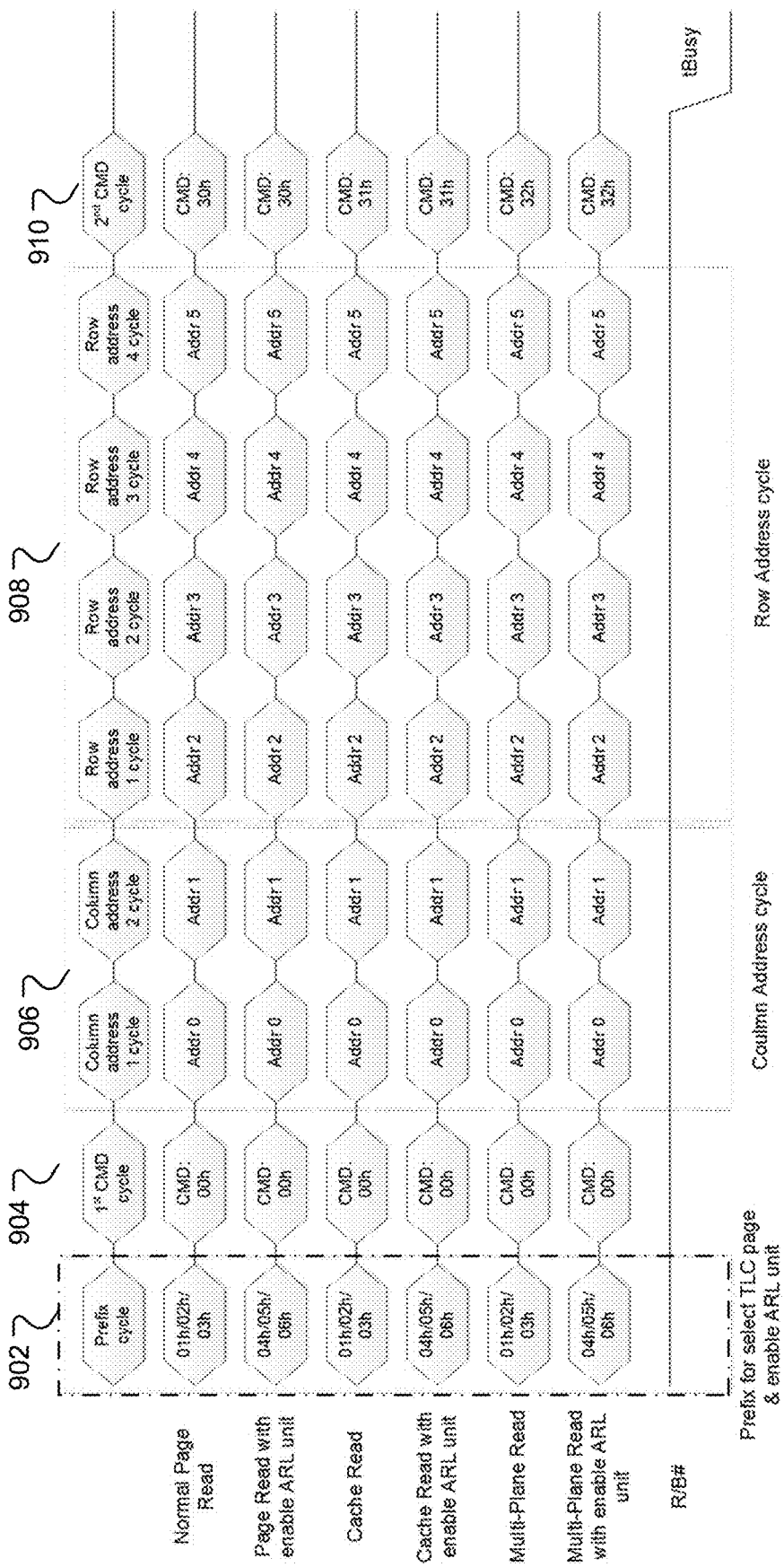
FIG. 9B illustrates an example of enabling an ARL unit with read operation using different prefix codes, according to one or more implementations of the present disclosure.
Figure 10A:
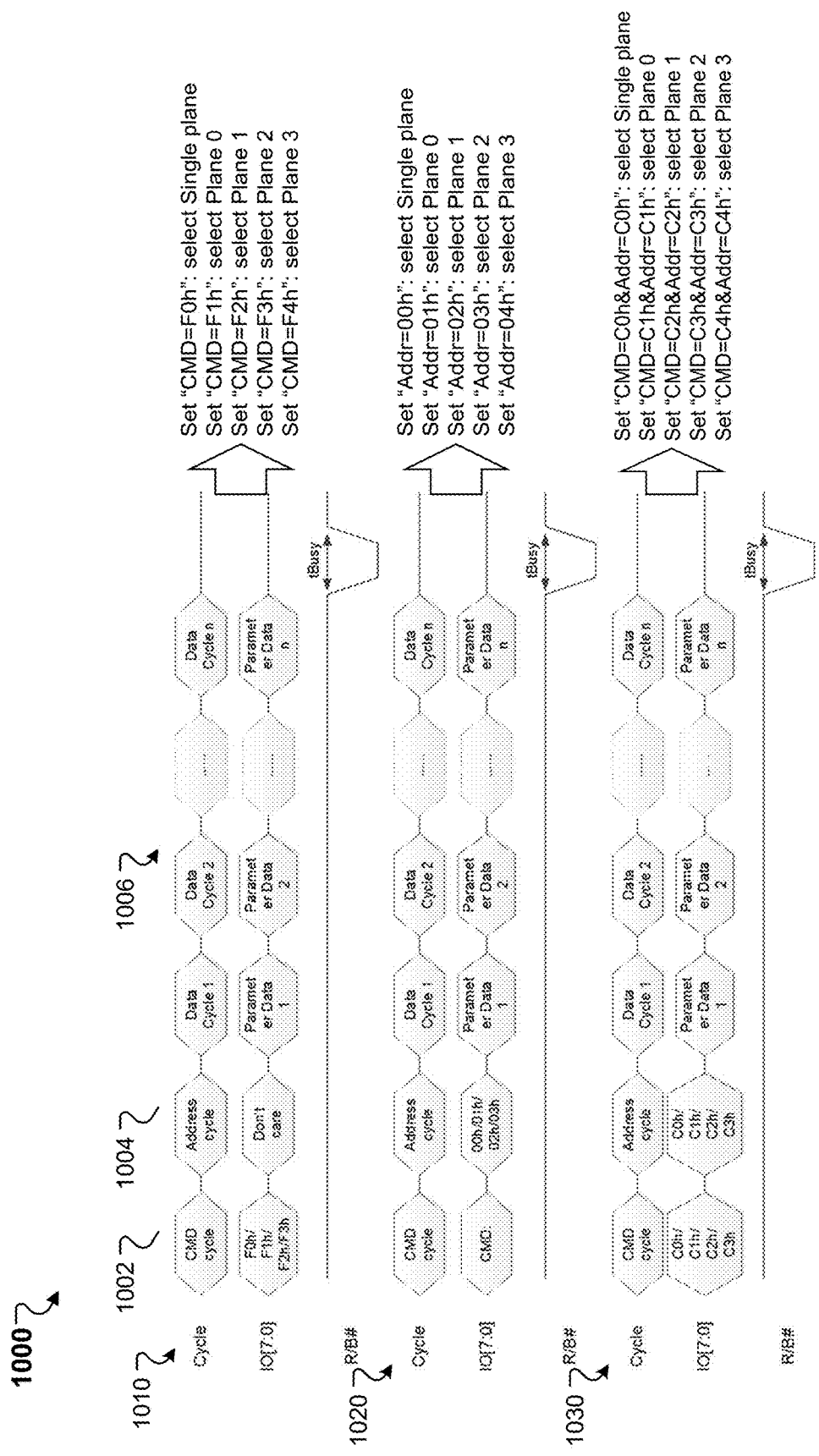
FIG. 10A illustrates an example of setting ARL parameters for different planes using command codes and/or address codes, according to one or more implementations of the present disclosure.
Figure 10B:
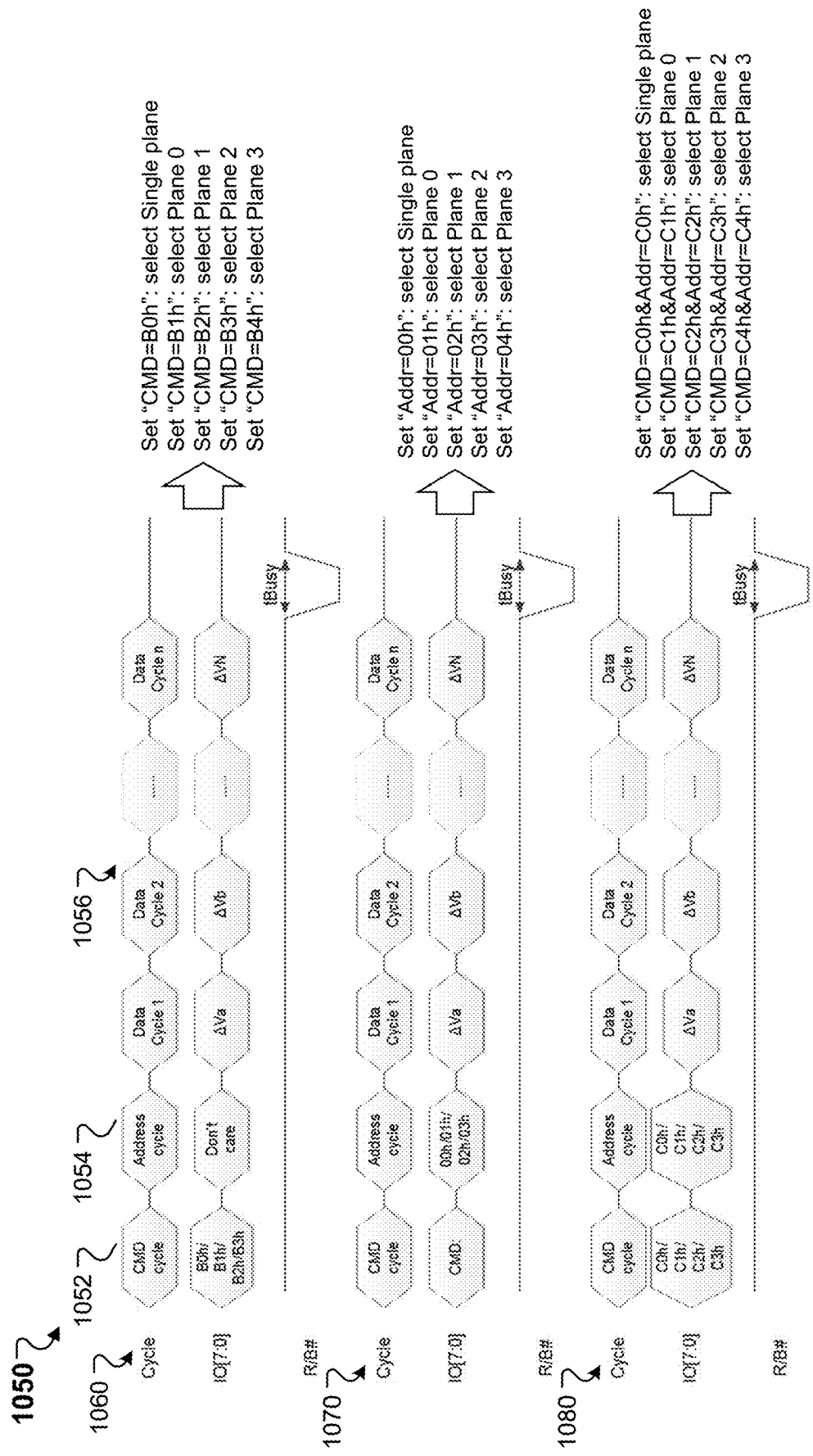
FIG. 10B illustrates an example of setting ARL values for different planes using command codes and/or address codes, according to one or more implementations of the present disclosure.
Figure 11:
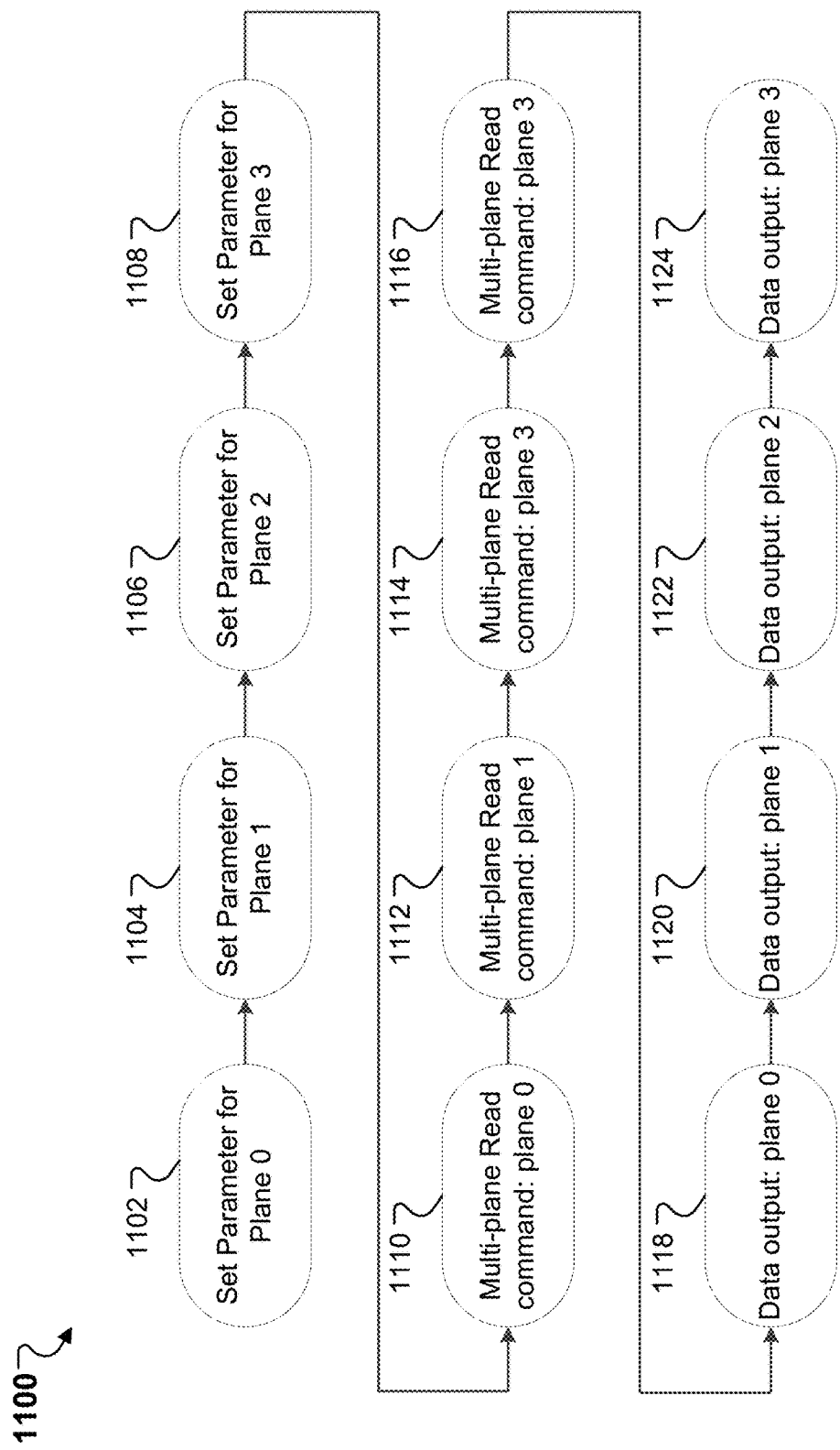
FIG. 11 illustrates an example of a command sequence of a multi-plane read operation, according to one or more implementations of the present disclosure.

The memory controller 202 can send commands to the memory device 210 to control the ARL unit 230. For example, the memory controller 202 can use different command cycle codes in a read command to decide whether to enable or disable the ARL unit 230, e.g., as illustrated in FIG. 9A. The memory controller 202 can also use different prefix cycle codes in a read command to decide whether to enable or disable ARL unit 230, e.g., as illustrated in FIG. 9B. The memory controller 202 can use command code, address code, or both to select a single plane in a single-plane operation or individual planes in a multi-plane operation, and store parameter data to a corresponding plane, e.g., as illustrated in FIG. 10A. The memory controller 202 can also use command code, address code, or both to select a single plane in a single-plane operation or individual planes in a multi-plane operation, and store ARL values to a corresponding plane, e.g., as illustrated in FIG. 10B. The memory controller can also use a command sequence to set a multi-plane read operation, e.g., as illustrated in FIG. 11.

Referring back to FIG. 2A, the memory controller 202 can includes a parameter table 204 for storing parameter data of a number of parameters that can impact reliability of blocks in the memory device 210. The number of parameters can include data retention time, erase cycle count, read disturbance count, write temperature, and/or any other related parameter.

FIG. 3 illustrates an example 300 of the parameter table 204 in the memory controller 202. The parameter table 204 can be stored in an internal memory, e.g., the internal memory 114 of FIG. 1A, of the memory controller 202. The parameter table 204 can store corresponding parameter data (or values) of the parameters for the blocks in the memory device 210. For example, the memory device 210 can include n blocks, e.g., block 0, block 1, block 2, . . . , block n−1, and block n, which can be arranged in one or more planes. The parameter table 204 stores corresponding values of the parameters for each block. For example, for block 0, the retention time is 1 hour, the erase cycle count is 10, the read distribution count is 1000, and the write temperature is 20° C. The memory controller 202 can keep updating, e.g., dynamically or periodically, the parameters in the parameter table 204 for the blocks in the memory device 210. As described with further details in FIG. 10A, the memory controller 202 can send the values of the parameters to the memory device 210 (e.g., the ARL unit 230), e.g., in specified commands.

As illustrated in FIG. 2A, the memory device 210 can include an internal parameter unit 228 configured to store a number of internal parameters that can impact reliability of blocks in the memory device 210. The internal parameters can include a block physical location, a page physical location, an internal temperature, and/or any other related parameter.

In some implementations, the memory device 210 includes a temperature sensor 226 configured to measure the internal temperature in the memory device 210 and output the measured internal temperature to the internal parameter unit 228. The temperature sensor 226 can keep monitoring the internal temperature in the memory device 210 and update the internal temperature to the internal parameter unit 228 when the internal temperature varies. The temperature sensor 226 can also measure the internal temperature and provide the internal temperature to the internal parameter unit 228 when the memory device 210 receives a read command.

The internal parameter unit 228 can be included in the control logic 216. In some implementations, the internal parameter unit 228 is configured to provide the internal parameters to the ARL unit 230, e.g., based on a read command. In some implementations, the internal parameter unit 228 is configured to be an internal parameter table, and the ARL unit 230 can retrieve the internal parameters from the internal parameter unit 228, e.g., based on a read command.

In some examples, the memory controller 202 receives a read command from an external device, e.g., the host device of 120 of FIG. 1A. The read command includes address information associated with blocks in the memory device 210, e.g., logical addresses of the blocks. The memory controller 202 can retrieve parameter data of parameters associated with the blocks in the parameter table 204 and send the parameter data with the read command to the memory device 210. The internal parameter unit 228 in the control logic 214 can send internal parameter data associated with the blocks and corresponding pages in the blocks to the ARL unit 230 based on the read command. The ARL unit 230 can determine adjusted read voltage levels for the corresponding pages in the blocks based on the parameter data from the parameter table 204 and the internal parameter data. The control logic 214 provides control signals for the determined adjusted read voltage levels to the voltage generator 216 for generating corresponding read voltages for the pages in the blocks. The control logic 214 also provides address information of the pages in the blocks to the address decoder 218. The address decoder 218 can select corresponding memory cells in the memory cell array 220 and provide one or more corresponding voltages generated by the voltage generator 216 to the memory cell arrays 220 through corresponding SSLs, WLs, and GSLs. Based on the read command, the memory device 210 can read data in the blocks and output the read data to the memory controller 202.

Figure 2B:
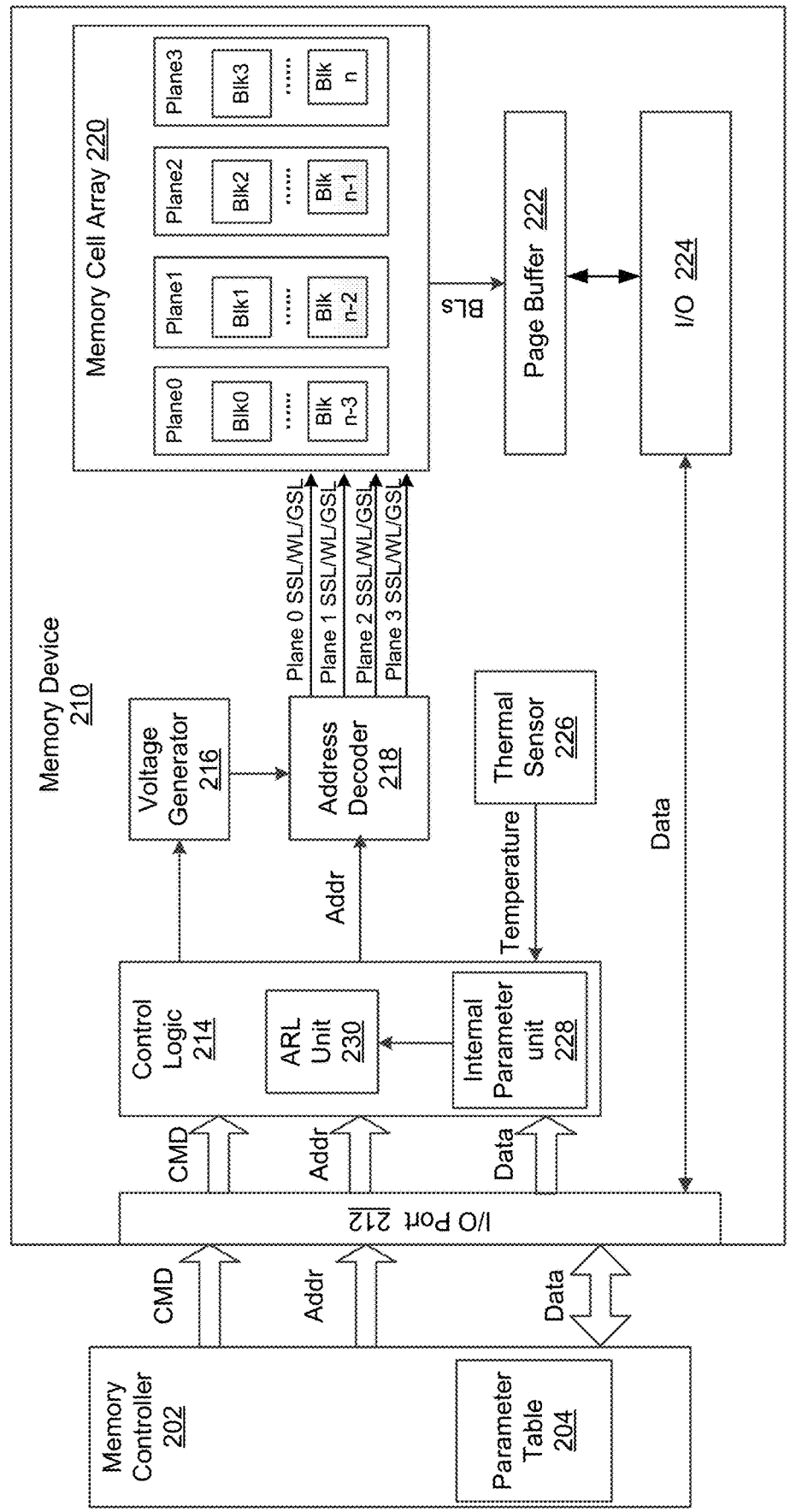
FIG. 2B illustrates an example of a memory system for multi-plane operations, according to one or more implementations of the present disclosure.

In some examples, the memory controller 202 receives a read command of multi-plane operation for reading data from blocks across multiple planes at the same time. As illustrated in FIG. 2B, the memory cell array 200 includes four planes (planes 0, 1, 2, 3) storing n blocks, where n is an integer. As an example, the multi-plane operation is for reading first data from block i of plane 0, second data from block j of plane 1, third data from block k of plane 2, and fourth data from block 1 of plane 3 at the same time, where each of i, j, k, l is an integer smaller than n. The memory controller 202 can send parameters associated with the blocks i, j, k, l in the parameter table 204 to the ARL unit 230. The internal parameter unit 228 also provides internal parameters associated with the blocks i, j, k, l and corresponding pages in the blocks to the ARL unit 230. The ARL unit 230 can then determine corresponding adjusted read voltage levels for the corresponding pages in the blocks i, j, k, l in the multiple planes 0, 1, 2, 3. The control logic 214 can provide the corresponding adjusted read voltage levels to the voltage generator 216 for generating corresponding read voltages for the corresponding pages in the blocks i, j, k, l. As illustrated in FIG. 2B, the address decoder 218 can select corresponding memory cells in each plane and provide one or more corresponding voltages generated by the voltage generator 216 to the plane through corresponding SSLs, WLs, and GSLs for the plane, e.g., SSL/WL/GSL for plane 0, SSL/WL/GSL for plane 1, SSL/WL/GSL for plane 2, or SSL/WL/GSL for plane 3.

FIG. 5 illustrates an example of an adjusted read level (ARL) unit 500 in a memory device, according to one or more implementations of the present disclosure. The memory device can be the memory 116 of FIG. 1A or 1B, or the memory device 210 of FIG. 2A or 2B. The ARL unit 500 can be the ARL unit 230 of FIG. 2A or 2B.

As illustrated in FIG. 5, the ARL unit 500 includes an ARL control logic 510. The ARL control logic 510 can include a control flag 512 and an ARL calculation module 514. The ARL unit 500 can also include one or more internal memories, e.g., random access memories (RAMs). For example, as illustrated in FIG. 5, the ARL unit 500 includes a first RAM 520 for storing ARL values and a second RAM 530 for storing ARL parameters.

The ARL control logic 510 is configured to receive parameter data 501 from a memory controller, e.g., the device controller 112 of FIG. 1A or the memory controller 202 of FIG. 2A or 2B. The memory controller can include a parameter table, e.g., the parameter table 204 of FIG. 2A or 2B, that stores data of a number of parameters for blocks in the memory. The parameter data 501 can be included in a specified command from the memory controller to the memory. The ARL control logic 510 is also configured to receive internal parameter data 503 from an internal parameter unit, e.g., the internal parameter unit 228 of FIG. 2A or 2B.

The ARL control logic 510 is configured to set the control flag 512 to decide how to generate one or more ARLs in a next read command, e.g., based on a specified command from the memory controller. If the specified command specifies to set the ARLs based on parameter data from the memory controller, the ARL control logic 510 sets the control flag 512 to determine the ARLs by the ARL calculation module 514 calculating the ARLs using the ARL parameters stored in the second RAM 530. The ARL unit 500 can then store the parameter data as ARL parameters in the second RAM 530. If the specified command specifies to set the ARLs based on ARL values in the specified command from the memory controller, the ARL control logic 510 can set the control flag 512 to determine ARLs based on the ARL values in the specified command. The ARL unit 500 can then store the ARL values in the first RAM 520. The ARL unit 500 can provide one or more control signals 505 corresponding to the ARLs to a voltage generator, e.g., the voltage generator 216 of FIG. 2A or 2B, for generating one or more corresponding read voltages.

FIGS. 6A-6B illustrate an example 600 of operating the ARL unit 500 in response to receiving ARL values from the memory controller. In some examples, the memory controller receives a single plane read command from an external device, e.g., the host device 120 of FIG. 1A. Based on the single plane read command, the memory controller can decide to enable the ARL unit 500 with one or more predicted read voltage levels as adjusted ARL values 601 for the single plane read command. For example, the single plane read command is for reading data from an MLC page. The adjusted ARL values 601 can be a series of offset values ΔVa, ΔVb, ΔVc for read voltages Va, Vb, Vc that can be default or predetermined read voltages for the MLC page. As illustrated in FIG. 6A or 6B, the series of offset values ΔVa, ΔVb, ΔVc can be +10 mV, +50 mV, -10 mV, respectively.

The memory controller can send a specified command to the memory device to store the adjusted ARL values 601 in the first RAM 520, and send the single plane read command to the memory device for reading data using the adjusted ARL values 601. The ARL control logic 510 can set the control flag 512, based on the specified command, to determine ARLs based on the adjusted ARL values 601. The memory device, e.g., the ARL unit 500, can store the adjusted ARL values 601 in the first RAM 520, as illustrated in FIG. 6A. Then, the memory device can enable the ARL control logic 510 based on the control flag 512 to determine the ARLs based on the stored ARL values. As illustrated in FIG. 6B, the ARL control logic 510 can retrieve the stored ARL values, e.g., +10 mV for ΔVa, +50 mV for ΔVb, and -10 mV for ΔVc, and calculate the ARLs using the ARL calculation module 514, e.g., Va'=Va+10 mV, Vb'=Vb+50 mV, and Vc'=Vc-10 mV. The ARL unit 500 can output the ARLs 605, e.g., Va', Vb', Vc, to the voltage generator.

FIGS. 7A-7B illustrates an example 700 of operating the ARL unit 500 in response to receiving ARL parameters from the memory controller. In some examples, the memory controller receives a single plane read command from an external device, e.g., the host device 120 of FIG. 1A. Based on the single plane read command, the memory controller can decide to enable the ARL unit 500 for a specified block or page, e.g., based on parameter data in the parameter table. The ARL unit 500 is enabled to determine ARLs for the specified block or page based on ARL parameter data 701 for the specified block or page. For example, as illustrated in FIG. 7A, the ARL parameter data 701 can include 1,000 hours for retention time, 20 for erase cycles, 10,000 for read disturbance counts, and 30° C. for write temperature. The memory controller can send a specified command including the ARL parameter data 701 to the memory device that can store the ARL parameter data 701. The memory controller can then send the single plane read command to the memory device for reading data.

The ARL control logic 510 can set the control flag 512, based on the specified command, to determine ARLs based on ARL parameter data. The memory, e.g., the ARL unit 500, can store the ARL parameter data 701 in the second RAM 530, as illustrated in FIG. 7A. Then, the memory device can enable the ARL control logic 510 based on the control flag 512 to determine the ARLs for the specified block or page. As illustrated in FIG. 7B, the ARL control logic 510 can retrieve the stored ARL parameter data 701 from the second RAM 530 and receive internal parameter data 703 for the specified block or page from the internal parameter unit 228. The internal parameter data 703 can include a physical location of the specified block or page and an internal temperature. The ARL control logic 510 can then calculate the ARLs 705 for the specified block or page using the ARL calculation module 514 based on the ARL parameter data 701 and the internal parameter data 703. Each of the ARLs 705 can be a sum of a default or predetermined read voltage and a calculated offset. For example, Va'=Va+A mV, Vb'=Vb+B mV, and Vc'=Vc+C mV. The ARL unit 500 can output the ARLs 705 to the voltage generator.

Figure 8A:
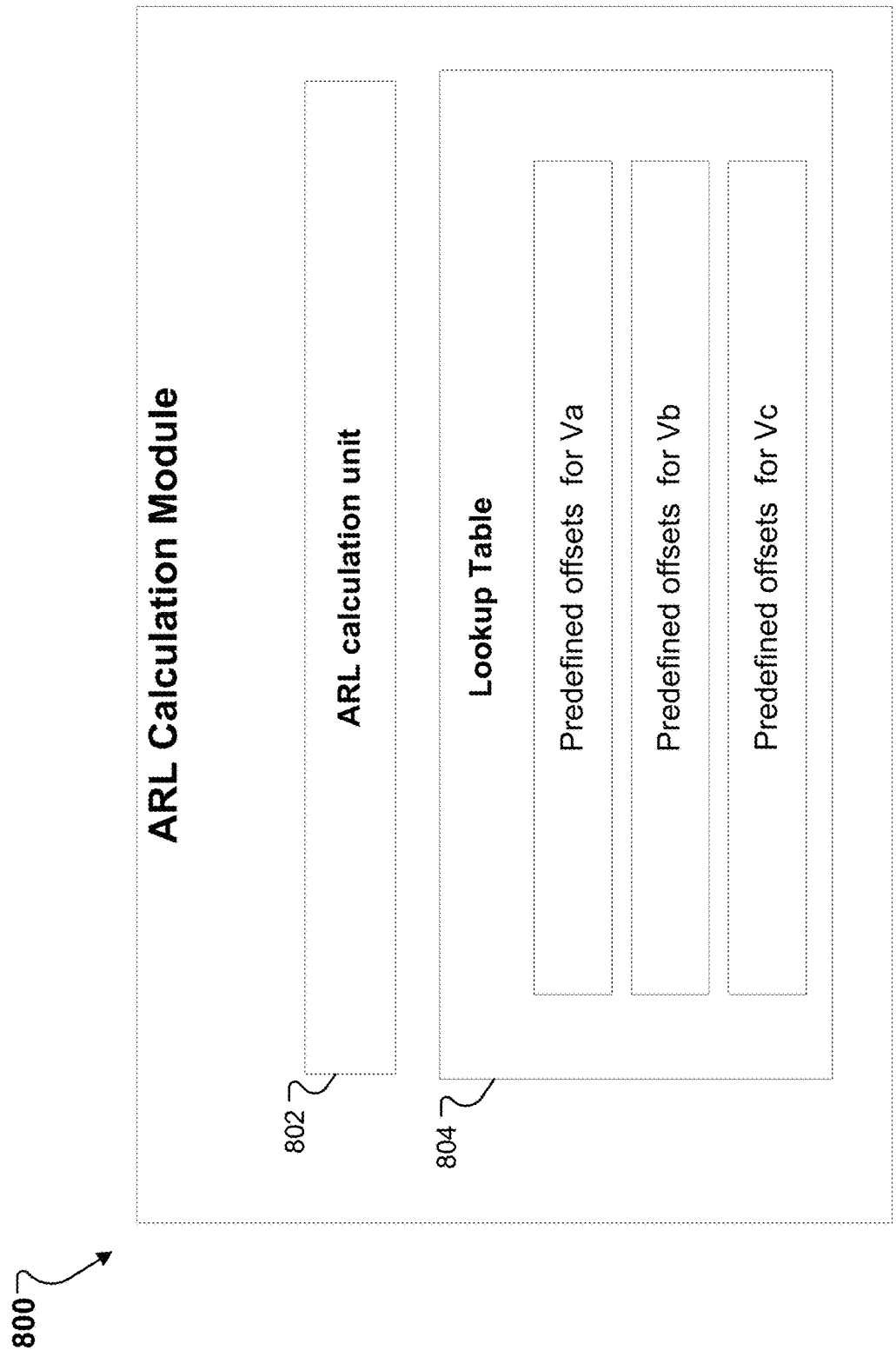

FIGS. 8A-8B illustrate an example of an ARL calculation module 800 in an ARL unit, according to one or more implementations of the present disclosure. The ARL unit can be the ARL unit 230 of FIG. 2A or 2B, or 500 of FIG. 5, 6A, 6B, 7A, or 7B. The ARL calculation module 800 can be the ARL calculation module 514 of FIG. 5, 6A, 6B, 7A, or 7B. As illustrated in FIG. 8A, the ARL calculation module 800 can include an ARL calculation unit 802 and a lookup table 804 that includes predefined offsets for read voltages, e.g., predefined offsets for Va, predefined offsets for Vb, and predefined offsets for Vc. The predefined offsets in the lookup table 804 can be determined from experimental results of one or more memories, machine learning, or empirical data. The predefined offsets can include a positive value or a negative value.

As illustrated in FIG. 8B, the lookup table 804 can include a number of predefined offset tables 810, 812, 814, 816, 818, 820 for a number of parameters that can affect reliability of a memory device. For example, the parameters can include parameters in a parameter table, e.g., the parameter table 204 of FIG. 2A or 2B, and internal parameters in an internal parameter unit, e.g., the internal parameter unit 228 of FIG. 2A or 2B. Each of the predefined offset tables includes corresponding offsets under different conditions for a respective parameter. For example, for read voltage Va, the predefined offset table 810 is for erase cycle count of a block and stores a number of offsets $\alpha 1, \alpha 2, \ldots, \alpha N$ for erase cycle count in corresponding ranges [0-499], [500-999], ..., [2500-2999]; the predefined offset table 812 is for retention time of a block and stores a number of offsets $01, 02, \ldots, 0N$ for retention time (hrs) in corresponding ranges [0-9,999], [10,000-19,999], ..., [10,000-99,999]; the predefined offset table 814 is for read disturbance count of a block and stores a number of offsets $\gamma 1, \gamma 2, \ldots, \gamma N$ for read disturbance count in corresponding ranges [0-9,999], [10,000-19,999], ..., [1,000,000-9,999,999]; the predefined offset table 816 is for temperature offset (a difference between write temperature and internal temperature) of a block and stores a number of offsets $\delta 1, \delta 2, \ldots, \delta N$ for temperature offset in corresponding ranges [0-19], [20-39], ..., [80-99]; the predefined offset table 818 is for block physical location of a block and stores a number of offsets $\epsilon 1, \epsilon 2, \ldots, \epsilon N$ for block physical location in corresponding regions "Heavy strong", "Slight strong", ..., "Heavy weak"; and the predefined offset table 820 is for page physical location of a page and stores a number of offsets $\zeta 1, \zeta 2, \ldots, \zeta N$ for page physical location in corresponding regions "Heavy strong", "Slight strong", ..., "Heavy weak".

The ARL calculation unit 802 can use the predefined offsets or the predefined offset tables in the lookup table 804 to calculate ARLs according to an algorithm or formula. For example, a read command is for reading data from page 100 in block 1 using a read voltage Va. Corresponding parameter data for the page 100 in block 1 from the memory controller include: 1,000 hours for retention time, 20 for erase cycle count, 10,000 for read disturbance count, 30° C. for write temperature. Corresponding internal parameter data for the page 100 in block 1 from the memory includes: "heavy weak" for block physical location, "slight strong" for page physical location, and 5° C. for internal temperature. The temperature offset is a difference between the write temperature and the internal temperature, e.g., 25° C. The ARL calculation unit 802 can calculate an adjusted read voltage Va' based on corresponding predefined offsets for the corresponding parameter data. For example, Va' can be identical to Va+(α1)+(β1)+(γ2)+(δ2)+(εN)+(ζ2).

A memory controller (e.g., the device controller 112 of FIG. 1A, or the memory controller 202 of FIG. 2A or 2B) can send a command to a memory device (e.g., the memory 116 of FIG. 1A or 1B, or the memory device 210 of FIG. 2A or 2B) including an ARL unit (e.g., the ARL unit 230 of FIG. 2A or 2B, or the ARL unit 500 of FIG. 5. The command can a read command for enabling or disabling the ARL unit, e.g., as described with further details in FIGS. 9A-9B. The command can be a specified set parameter command where parameter data from the memory controller is in data cycles of the command, e.g., as described with further details in FIG. 10A. The command can be a specified set value command where ARL values from the memory controller are in data cycles of the command, e.g., as described with further details in FIG. 10B. The memory controller can also send a command sequence to the memory device for performing a multi-plane operation, e.g., as described with further details in FIG. 11.

FIGS. 9A-9B illustrate examples 900, 950 of enabling or disabling the ARL unit with read operation. The memory controller sends a read command to the memory device. The read command can include prefix cycle code 902, 1$^{st}$ CMD cycle code 904, Column address cycle code 906, Row address cycle code 908, and 2$^{nd}$ CMD cycle code 910. R/B #represents a status of the memory device. A high status shows that the memory device is in a ready state and can access a new command, while a low status shows that the memory device is in a busy state and cannot access a new command.

For example, if the read command is for reading a TLC page, a normal page read command can be 01h/02h/03h as prefix cycle code 902, CMD:00h as 1$^{st}$ CMD cycle code 904, Addr 0 and Addr 1 for Column address cycle code 906, Addr 2, Addr 3, Addr 4, and Addr 5 for Row address cycle code 908, and CMD: 30h for 2$^{nd}$ CMD cycle code 910. A cache read command can be the same as the normal page read command except that the 2$^{nd}$ CMD cycle code 910 is CMD: 31h. A multi-plane read command can be same as the normal page read command except that the 2$^{nd}$ CMD cycle code is CMD: 32h.

In some examples, the memory controller can use different 2$^{nd}$ CMD cycle codes 910 to decide whether to enable or disable the ARL unit with the read operation. As illustrated in FIG. 9A, the page read command with enabling the ARL unit can be the same as normal page read command except that the 2$^{nd}$ CMD cycle code 910 is changed to CMD: 3Ch. Similarly, the cache read command with enabling the ARL unit can be the same as the cache read command except that the 2$^{nd}$ CMD cycle code 910 is changed to CMD: 3Dh. The multi-plane read command with enabling the ARL unit can be the same as the cache read command except that the 2nd CMD cycle code 910 is changed to CMD: 3Eh.

In some examples, the memory controller can use different prefix cycle codes 902 to decide whether to enable or disable the ARL unit with the read operation. As illustrated in FIG. 9B, the page read command with enabling the ARL unit can be the same as the normal page read command except that the prefix cycle code 902 is changed to 04h/05h/06h. Similarly, the cache read command with enabling the ARL unit can be the same as the cache read command except that the prefix cycle code 902 is changed to 04h/05h/06h. The multi-plane read command with enabling the ARL unit can be the same as the cache read command except that the prefix cycle code 902 is changed to 04h/05h/06h.

FIG. 10A illustrates an example 1000 of setting parameter data to different planes using command codes and/or address codes, according to one or more implementations of the present disclosure. The memory controller sends a specified command to the memory device. The specified command can include CMD cycle code 1002, address cycle code 1004, and data cycle code 1006. The data cycle code 1006 can include n data cycles, where n can be defined for use, e.g., 1, 2, 4, . . . . The data cycle code 1006 is configured to include parameter data from the memory controller, e.g., the parameter data 701 of FIGS. 7A-7B. The memory controller can use the CMD cycle code 1002, the address cycle code 1004, or both to configure a single plane setting or a multi-plane setting.

A specified command 1010 uses the CMD cycle code 1002 to distinguish a single plane operation from individual multiple planes in a multi-plane operation. For example, when the CMD cycle code 1002 is F0h, the specified command 1010 selects a single plane; when the CMD cycle code 1002 is F1h, the specified command 1010 selects Plane 0; when the CMD cycle code 1002 is F2h, the specified command 1010 selects Plane 1; when the CMD cycle code 1002 is F3h, the specified command 1010 selects Plane 2; and when the CMD cycle code 1002 is F4h, the specified command 1010 selects Plane 4.

A specified command 1020 uses the address cycle code 1004 to distinguish a single plane operation from individual multiple planes in a multi-plane operation. For example, when the address cycle code 1004 is 00h, the specified command 1020 selects a single plane; when the address cycle code 1004 is 01h, the specified command 1020 selects Plane 0; when the address cycle code 1004 is 02h, the specified command 1020 selects Plane 1; when the address cycle code 1004 is 03h, the specified command 1020 selects Plane 2; and when the address cycle code 1004 is 04h, the specified command 1020 selects Plane 3.

A specified command 1030 uses a combination of the CMD cycle code 1002 and the address cycle code 1004 to distinguish a single plane operation from individual multiple planes in a multi-plane operation. For example, when the CMD cycle code 1002 and the address cycle code 1004 are C0h and 00h, the specified command 1030 selects a single plane; when the CMD cycle code 1002 and the address cycle code 1004 are C1h and 01h, the specified command 1030 selects Plane 0; when the CMD cycle code 1002 and the address cycle code 1004 are C2h and 02h, the specified command 1030 selects Plane 1; when the CMD cycle code 1002 and the address cycle code 1004 are C3h and 03h, the specified command 1030 selects Plane 2; and when the CMD cycle code 1002 and the address cycle code 1004 are C4h and 04h, the specified command 1030 selects Plane 3.

FIG. 10B illustrates an example 1050 of setting ARL values to different planes using command codes and/or address codes, according to one or more implementations of the present disclosure. The memory controller sends a specified command to the memory device. The specified command can include CMD cycle code 1052, address cycle code 1054, and data cycle code 1056. Different from the data cycle code 1006 in FIG. 10A, the data cycle code 1056 in FIG. 10B is configured to include ARL values (e.g., ΔVa, ΔVb, . . . , ΔV$_N$) from the memory controller, e.g., the ARL values 601 of FIGS. 6A-6B. The memory controller can use the CMD cycle code 1052, the address cycle code 1054, or both to configure a single plane setting or a multi-plane setting.

A specified command 1060 uses the CMD cycle code 1052 to distinguish a single plane operation from individual multiple planes in a multi-plane operation. For example, when the CMD cycle code 1052 is B0h, the specified command 1060 selects a single plane; when the CMD cycle code 1052 is B1h, the specified command 1060 selects Plane 0; when the CMD cycle code 1052 is B2h, the specified command 1060 selects Plane 1; when the CMD cycle code 1052 is B3h, the specified command 1060 selects Plane 2; and when the CMD cycle code 1052 is B4h, the specified command 1060 selects Plane 4.

A specified command 1070 uses the address cycle code 1054 to distinguish a single plane operation from individual multiple planes in a multi-plane operation. For example, when the address cycle code 1054 is 00h, the specified command 1070 selects a single plane; when the address cycle code 1054 is 01h, the specified command 1070 selects Plane 0; when the address cycle code 1054 is 02h, the specified command 1070 selects Plane 1; when the address cycle code 1054 is 03h, the specified command 1070 selects Plane 2; and when the address cycle code 1054 is 04h, the specified command 1070 selects Plane 3.

A specified command 1080 uses a combination of the CMD cycle code 1052 and the address cycle code 1054 to distinguish a single plane operation from individual multiple planes in a multi-plane operation. For example, when the CMD cycle code 1052 and the address cycle code 1054 are C0h and 00h, the specified command 1080 selects a single plane; when the CMD cycle code 1052 and the address cycle code 1054 are C1h and 01h, the specified command 1080 selects Plane 0; when the CMD cycle code 1052 and the address cycle code 1054 are C2h and 02h, the specified command 1080 selects Plane 1; when the CMD cycle code 1052 and the address cycle code 1054 are C3h and 03h, the specified command 1080 selects Plane 2; and when the CMD cycle code 1052 and the address cycle code 1054 are C4h and 04h, the specified command 1080 selects Plane 3.

FIG. 11 illustrates an example 1100 of a command sequence of a multi-plane read operation, according to one or more implementations of the present disclosure. The memory can include four planes: Plane 0, Plane 1, Plane 2, Plane 3. The command sequence can include a first command 1102 for setting parameter data for Plane 0, a second command 1104 for setting parameter data for Plane 1, a third command 1106 for setting parameter data for Plane 2, and a fourth demand for setting parameter data for Plane 3. Each of the commands 1102, 1104, 1106, 1108 can be the specified command 1010, 1020, or 1030 of FIG. 10A. Then the command sequence can include a first multi-plane read command 1110 for reading data from Plane 0, a second multi-plane read command 1112 for reading data from Plane 1, a third multi-plane read command 1114 for reading data from Plane 2, and a fourth multi-plane read command 1116 for reading data from Plane 3. The memory device can determine corresponding ARLs based on the parameter data for the planes and generate corresponding read voltages for reading the data from the planes. The command sequence can then include a first data output command 1118 for getting the data from Plane 0, a second data output command 1120 for getting the data from Plane 1, a third data output command 1122 for getting the data from Plane 2, and a fourth data output command 1124 for getting the data from Plane 3.

Figures 12A, 12B:
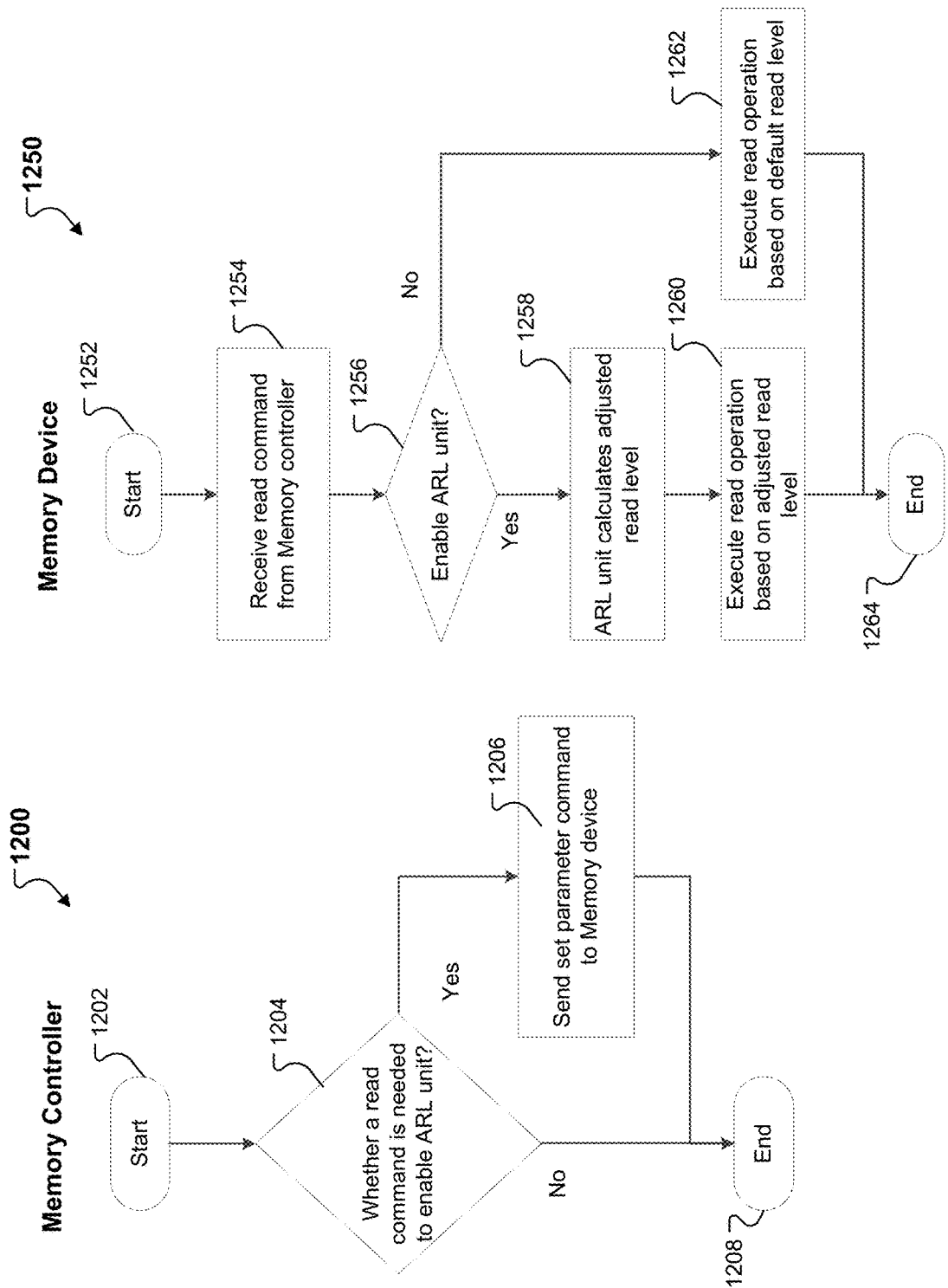
FIG. 12A illustrates an example of a process for enabling an ARL unit for a read operation by a memory controller, according to one or more implementations.
FIG. 12B illustrates an example of a process for enabling an ARL unit for a read operation by a memory device, according to one or more implementations.

FIG. 12A illustrates an example of a process 1200 for enabling an ARL unit in a memory device for a read operation by a memory controller, according to one or more implementations. FIG. 12B illustrates an example of a process 1250 for enabling the ARL unit for the read operation by the memory device, according to one or more implementations. The memory controller can be the device controller 112 of FIG. 7A, or the memory controller 202 of FIG. 2A or 2B. The memory device can be the memory 116 of FIG. 1A or 1B, or the memory device 210 of FIG. 2A or 2B. The ARL unit can be the ARL unit 230 of FIG. 2A or 2B, or the ARL unit 500 of FIG. 5, 6A, 6B, 7A or 7B.

The memory controller includes a parameter table, e.g., the parameter table 204 of FIG. 2A or 2B, that stores parameter data for a number of parameters associated with blocks/pages of the memory device. The parameters can impact reliability of the blocks/pages of the memory device. The parameters can include data retention time, erase cycle count, read disturbance count, and/or write temperature. The memory device can include an internal parameter unit, e.g., the internal parameter unit 228 of FIG. 2A or 2B. The internal parameter unit can store internal parameter data of a number of internal parameters that can impact reliability of the blocks/pages of the memory. The internal parameters can include block physical location, page physical location, and/or internal temperature of the memory device.

At 1202, the process 1200 starts. The memory controller can start the process 1200, e.g., in response to receiving a read command from an external device, e.g., the host device 120 of FIG. 1A.

At 1204, the memory controller decides whether the read command is needed to enable the ARL unit. The read command can be for reading a specified block or page in the memory device. The memory controller can decide whether the read command is needed to enable the ARL unit based on parameter data for the specified block or page in the parameter table. For example, if a read disturbance count of the specified block is beyond a predetermined threshold, the memory controller can decide that the read command is needed to enable the ARL unit.

If the memory controller determines that the read command is needed to enable the ARL unit, at 1206, the memory controller sends a set parameter command to the memory device (1206). The set parameter command can the specified command 1010, 1020, or 1030 of FIG. 10A. At 1208, the process 1200 ends. If the memory controller determines that there is no need for the read command to enable the ARL unit, the process 1200 also ends at 1208.

Referring to FIG. 12B, at 1252, the process 1250 starts. At 1254, the memory device receives the read command from the memory controller. The read command can be a normal read command or a specified read command including a command code for enabling or disabling the ARL unit. The specified read command can include a prefix cycle code or a CMD cycle code for enabling the ARL unit, as illustrated in FIG. 9A or 9B.

At 1256, the memory device determines whether to enable the ARL unit, e.g., based on the prefix cycle code or the CMD cycle code in the read command. If the memory device determines to enable the ARL unit, at 1258, the ARL unit in the memory device calculates ARLs, e.g., based on parameter data from the memory controller and/or internal parameter data from the internal parameter unit. As illustrated in FIGS. 8A and 8B, the ARL unit can include a lookup table, e.g., the lookup table 804 of FIGS. 8A and 8B. The lookup table can store predefined offsets for different read voltages. The lookup table 804 can include predefined offset tables for different parameters that can impact the reliability of the memory device. The ARL unit can calculate the ARLs using an algorithm or formula, e.g., by adding up a number of predefined offsets for the specified block or page based on the parameter data for the specified block or page. The memory device can include a voltage generator for generating corresponding read voltages based on the ARLs. At 1260, the memory device executes a read operation with the generated read voltages based on the ARLs. If the memory device determines not to enable the ARL unit, at 1262, the memory device executes the read operation based on default read voltages with default read levels. At 1264, the process 1250 ends. The memory device can execute the read operation to read data from the specified block or page and output the data to the memory controller.

Figure 13A:
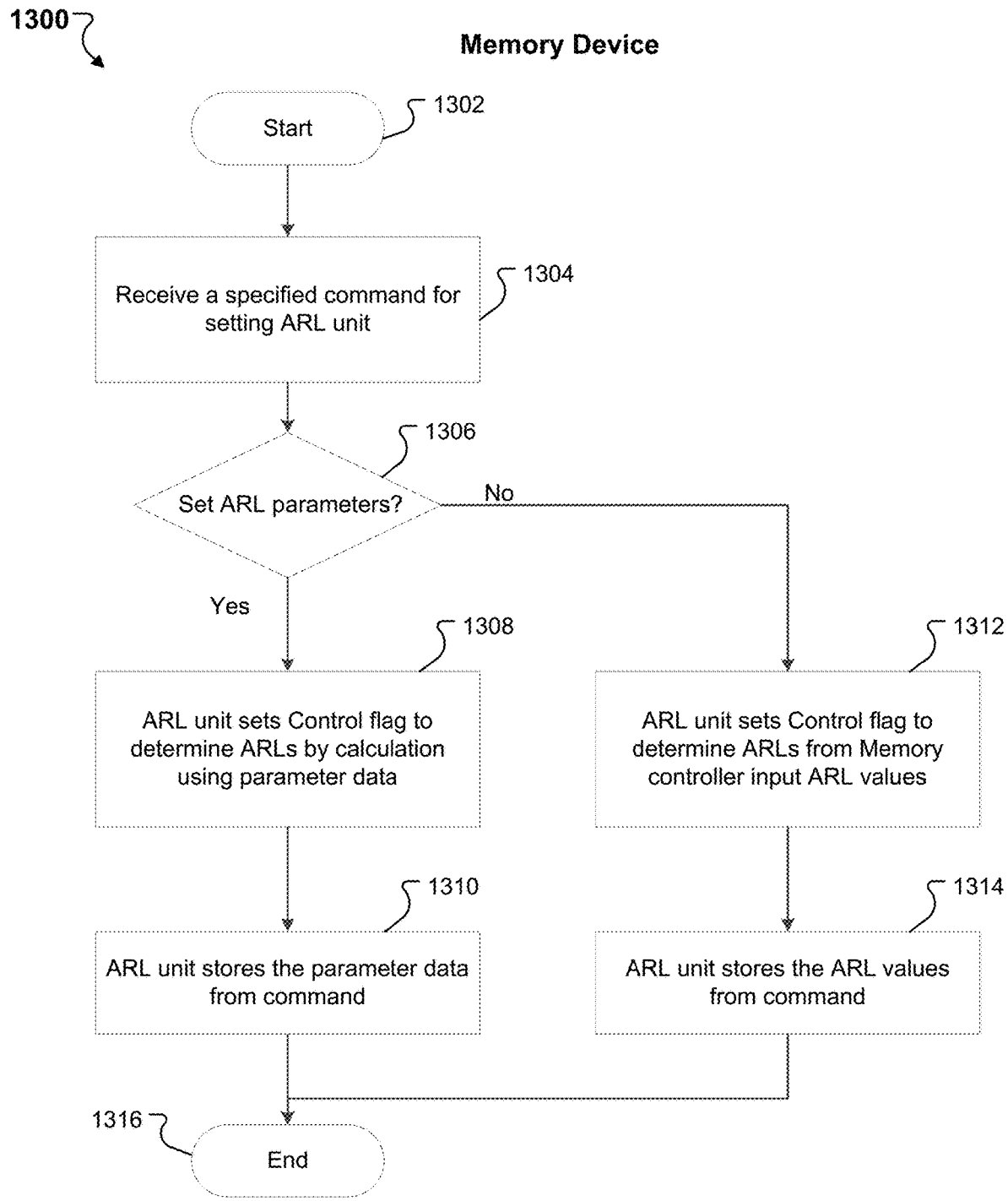
FIG. 13A illustrates an example of a process for setting an ARL unit by a memory device, according to one or more implementations.

FIG. 13A illustrates an example of a process 1300 for setting an ARL unit by a memory device, according to one or more implementations. The memory device can be the memory 116 of FIG. 1A or 1B, or the memory device 210 of FIG. 2A or 2B. The ARL unit can be the ARL unit 230 of FIG. 2A or 2B, or the ARL unit 500 of FIG. 5. The ARL unit can include an ARL control unit, e.g., the ARL control unit 510 of FIG. 5, and one or more internal memories, e.g., the first RAM 520 and the second RAM 530 of FIG. 5. The ARL control unit can include a control flag, e.g., the control flag 512 of FIG. 5, and an ARL calculation module, e.g., the ARL calculation module 514 of FIG. 5, or 800 of FIG. 8A or 8B.

At 1302, the process 1300 starts. At 1304, the memory device receives a specified command for setting the ARL unit from a memory controller. The memory controller can be the device controller 112 of FIG. 1A, or the memory controller 202 of FIG. 2A or 2B.

At 1306, the memory device determines whether the specified command is for setting ARL parameters. If the specified command is for setting the ARL parameters, e.g., when the specified command includes parameter data (e.g., the parameter data 701 of FIGS. 7A-7B) from the memory controller, at 1308, the ARL unit sets the control flag in the ARL control unit to determine ARLs by calculation using the parameter data. At 1310, the ARL unit stores the parameter data from the specified command in a first internal memory, e.g., the RAM 530 of FIG. 5. If the specified command is not for setting the ARL parameters, e.g., when the specified command includes ARL values (e.g., the ARL values 601 of FIGS. 6A-6B) from the memory controller, at 1312, the ARL unit sets the control flag in the ARL control unit to determine ARLs based on ARL values from the memory controller. At 1314, the ARL unit stores the ARL values from the specified command in a second internal memory, e.g., the RAM 520 of FIG. 5. At 1316, the process 1300 ends.

Figure 13B:
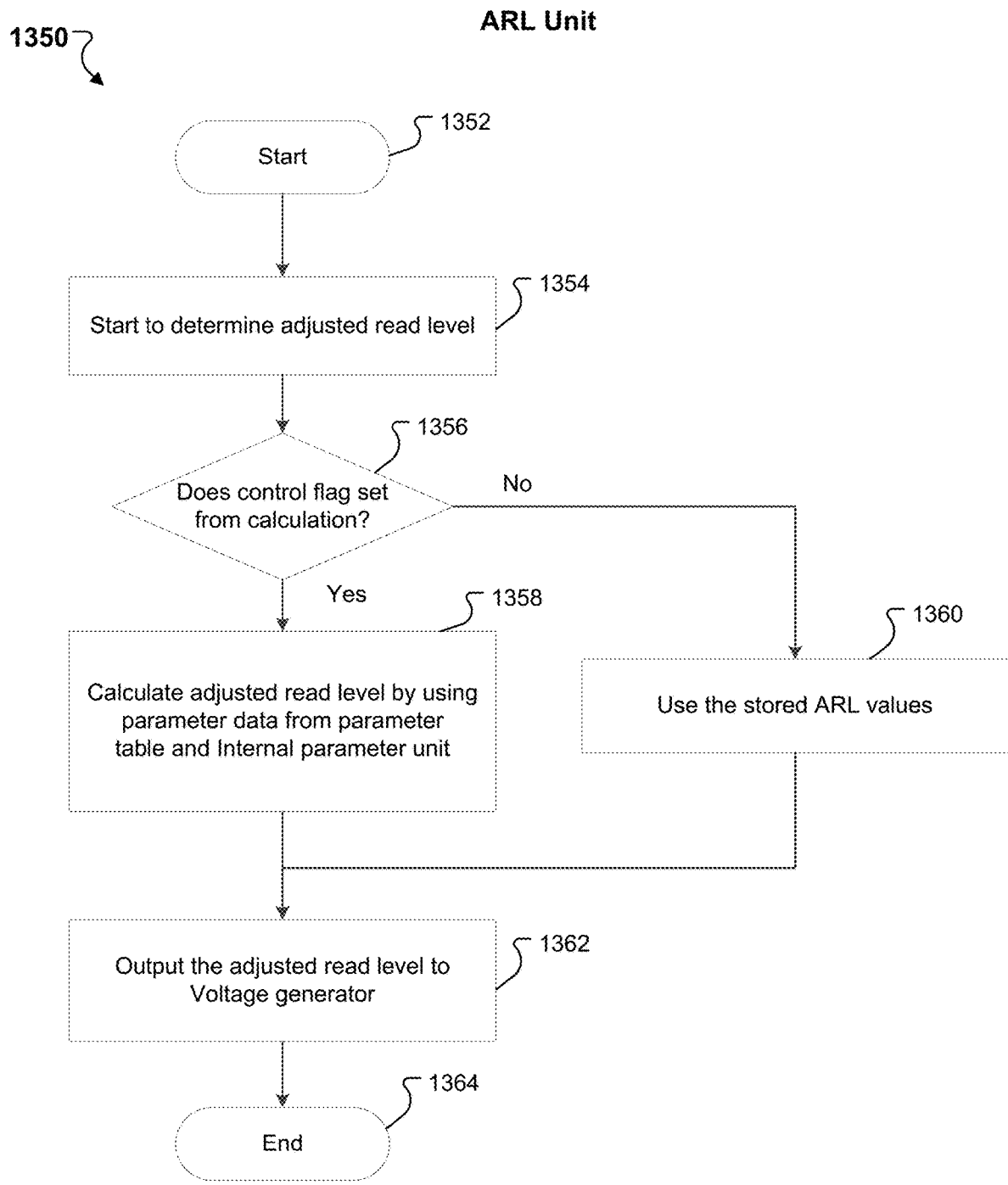
FIG. 13B illustrates an example of a process for generating an ARL value for a read operation using an ARL unit, according to one or more implementations.

FIG. 13B illustrates an example of a process 1350 for generating ARLs for a read operation using the ARL unit, according to one or more implementations. At 1352, the process 1350 starts. At 1354, the ARL unit starts to determine ARLs. For example, the ARL unit can start to determine the ARLs in response to determining that a read command includes a command code for enabling the ARL unit, e.g., at step 1256 of FIG. 12B. The ARL unit can also start to determine the ARLs in response to determining that the specified command sets the ARL unit, e.g., at step 1304 of FIG. 13A.

At 1356, the ARL unit determine whether the control flag sets to determine the ARLs from calculation, e.g., by the ARL calculation module. If the control flag sets to determine the ARLs from the calculation, at 1358, the ARL unit, e.g., the ARL calculation module, calculates the ARLs using parameter data from the parameter table of the memory controller and internal parameter data from the internal parameter unit. If the control flag sets to determine the ARLs not from calculation, at 1360, the ARL unit, e.g., the ARL calculation module, calculates the ARLs using stored ARL values, e.g., received from the memory controller and stored in the RAM 520 of FIG. 5. At 1362, the ARL unit outputs the calculated ARLs to a voltage generator, e.g., the voltage generator 216 of FIGS. 2A-2B. The voltage generator can generate corresponding read voltages based on the calculated ARLs, e.g., as illustrated in FIG. 6B or 7B. The memory device can then execute a read operation using the generated read voltages.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specified integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specified to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory system comprising:
   a memory device comprising:
      a plurality of blocks; and
      circuitry coupled to the plurality of blocks, the circuitry comprising an adjusted read level (ARL) circuit; and
   a memory controller coupled to the memory device and configured to send a read command to the memory device, the read command comprising address information of at least one block in the memory device,
   wherein the circuitry of the memory device is configured to:
      receive the read command from the memory controller;
      determine whether the read command comprises an indication for enabling adjusted read level (ARL) determination;
      in response to determining that the read command comprises the indication for enabling the ARL determination, determine at least one adjusted read voltage for the at least one block using the ARL circuit; and
      execute a read operation based on the at least one adjusted read voltage according to the read command, and
   wherein the memory controller is configured to:
      determine whether or not to enable the ARL determination for the read command;
      in response to determining to enable the ARL determination for the read command, send a specified command to the memory device, the specified command comprising ARL information for determining the at least adjusted read voltage for the at least one block in the memory device, wherein the ARL information comprises: first parameter data of at least one first parameter associated with the at least one block or ARL data for the at least one block;
      in response to determining that the ARL information comprises the first parameter data, set a control flag in the memory device to indicate the ARL determination based on the first parameter data; and
      store the first parameter data in a first internal memory in the memory device.

2. The memory system of claim 1, wherein the circuitry of the memory device is configured to:
   receive the specified command from the memory controller;
   store the ARL information in the memory device; and
   determine the at least one adjusted read voltage based on the stored ARL information.

3. The memory system of claim 1, wherein the at least one first parameter comprises at least one of retention time, erase cycle count, read disturbance count, or write temperature,
   wherein the first parameter data comprises at least one respective value of the at least one first parameter for the at least one block, and
   wherein the ARL data comprises at least one read voltage offset for the at least one block.

4. The memory system of claim 1, wherein the memory controller is configured to:
   determine second parameter data of at least one second parameter for the at least one block based on the read command; and
   in response to determining that the control flag indicates the ARL determination based on the first parameter data, determine the at least one adjusted read voltage based on
      the first parameter data stored in the first internal memory and
      the second parameter data of the at least one second parameter.

5. The memory system of claim 4, wherein the at least one second parameter comprises at least one of a block physical location in the memory device, a page physical location in the memory device, or an internal temperature of the memory device, and
   wherein the second parameter data comprises at least one respective value for the at least one second parameter.

6. The memory system of claim 4, wherein the circuitry of the memory device is configured to:
   determine, for each read voltage of the at least one block, a respective predefined offset for each parameter of the at least one first parameter and the at least one second parameter based on the first parameter data and the second parameter data; and
   determine a corresponding adjusted read voltage for the at least one block based on the read voltage and the respective predefined offsets of the at least one first parameter and the at least one second parameter for the read voltage.

7. The memory system of claim 4, wherein the circuitry of the memory device is configured to:
   maintain, for each parameter of the at least one first parameter and the at least one second parameter, a respective table associating predefined offsets with corresponding values of the parameter.

8. The memory system of claim 1, wherein the circuitry of the memory device is configured to:
in response to determining that the ARL information comprises the ARL data, set a control flag in the memory device to indicate the ARL determination based on the ARL, data;
store the ARL data in a second internal memory of the memory device; and
determine the at least one adjusted read voltage based on the ARL data stored in the second internal memory.

9. The memory system of claim 1, wherein the specified command comprises a command cycle code, an address cycle code, and at least one data cycle code, and
wherein the ARL information is included in the at least one data cycle code.

10. The memory system of claim 9, wherein the memory device comprises multiple planes having the plurality of blocks, and
wherein at least one of the command cycle code or the address cycle code is configured to select a single plane for a single plane operation or an individual plane for a multi-plane operation.

11. The memory system of claim 1, wherein the read command comprises a prefix cycle code and a command cycle code, and
wherein one of the prefix cycle code and the command cycle code is configured to include the indication for enabling the ARL determination.

12. The memory system of claim 1, wherein the memory device comprises multiple planes having the plurality of blocks,
wherein the read operation is a multi-plane operation, and the at least one block comprises a respective block in each plane of the planes, and
wherein the ARL circuit is configured to:
determine, for each of the respective blocks in the planes, a different corresponding adjusted read voltage.

13. The memory system of claim 12, wherein the circuitry of the memory device is configured to:
sequentially receive a respective specified command for each plane of the planes from the memory controller, the respective specified command comprising corresponding ARL information for determining the different corresponding adjusted read voltage for the respective block in the plane;
sequentially receive a respective read command for each plane of the planes from the memory controller;
determine, for each of the respective blocks in the planes, the different corresponding adjusted read voltage based on the corresponding ARL information and the respective read command;
execute the multi-plane operation based on the corresponding adjusted read voltages for the respective blocks in the planes according to the respective read commands; and
sequentially output respective memory data read from each of the respective blocks in the planes to the memory controller.

14. A memory system comprising:
a memory device comprising a plurality of blocks; and
a memory controller coupled to the memory device and configured to maintain first parameter data of at least one first parameter associated with the blocks,
wherein the memory device comprises an adjusted read level (ARL) circuit that is configured to determine at least one read voltage for a specified block in the blocks based on corresponding first parameter data for the specified block from the memory controller,
wherein the memory controller is configured to:
determine whether or not to enable an ARL determination for a read command;
in response to determining to enable the ARL determination for the read command, send a specified command to the memory device, the specified command comprising ARL information for determining at least one adjusted read voltage for at least one block in the memory device, wherein the ARL information comprises: first parameter data of the at least one first parameter associated with the at least one block or ARL data for the at least one block, and
wherein the memory device is configured to:
in response to determining that the ARL information comprises the ARL data, set a control flag in the memory device to indicate the ARL determination based on the ARL data;
store the ARL data in an internal memory of the memory device; and
determine the at least one adjusted read voltage based on the ARL data stored in the internal memory of the memory device.

15. The memory system of claim 14, wherein the ARL circuit of the memory device is configured to:
determine second parameter data of at least one second parameter for the specified block, and
determine the at least one read voltage for the specified block based on corresponding second parameter data for the specified block.

16. A memory device comprising:
a memory cell array having a plurality of blocks; and
circuitry coupled to the memory cell array, the circuitry comprising an adjusted read level (ARL) circuit and being configured to:
receive a read command from a memory controller, the read command comprising address information of at least one block in the memory cell array;
determine whether the read command comprises an indication for enabling adjusted read level (ARL) determination;
in response to determining that the read command comprises the indication for enabling the ARL determination; determine at least one adjusted read voltage for the at least one block using the ARL circuit; and
execute a read operation based on the at least one adjusted read voltage according to the read command,
wherein the ARL circuit comprises:
a first internal memory configured to store ARL parameters received from the memory controller;
a second internal memory configured to store ARL data received from the memory controller; and
an ARL control circuit comprising:
a control flag register configured to store an indication of ARL determination from one of the ARL parameters and the ARL data, and
an ARL calculation circuit configured to calculate the at least one adjusted read voltage for the at least one block based on the one of the ARL parameters and the ARL data according to the indication in the control flag register.

17. The memory device of claim 16, wherein the ARL circuit is configured to:
   receive first parameter data of at least one first parameter for the at least one block from the memory controller;
   determine second parameter data of at least one second parameter for the at least one block; and
   determine the at least one adjusted read voltage for the at least one block based on the first parameter data and the second parameter data.

18. The memory device of claim 17, wherein the circuitry comprises:
   an internal parameter circuit configured to store the second parameter data of the at least one second parameter.

19. The memory device of claim 8, wherein the ARL calculation circuit comprises: a plurality of predefined offset tables for the at least one first parameter and the at least one second parameter, and
   wherein each of the plurality of predefined offset tables is configured to associate predefined offsets with corresponding values of a corresponding parameter.

20. The memory device of claim 19, wherein the ARL calculation circuit is configured to:
   determine, for each read voltage of the at least one block, a respective predefined offset for each parameter of the at least one first parameter and the at least one second parameter based on the first parameter data and the second parameter data; and
   determine a corresponding adjusted read voltage for the at least one block based on the read voltage and the respective predefined offsets of the at least one first parameter and the at least one second parameter for the read voltage.

21. A memory system comprising:
   a memory device comprising multiple planes having a plurality of blocks; and
   a memory controller coupled to the memory device and configured to send a read command to the memory device, the read command comprising address information of at least one block in the memory device, the at least one block comprising a respective block in each plane of the planes,
   wherein the memory device comprises circuitry configured to:
      determine whether the read command comprises an indication for enabling adjusted read level (ARL) determination;
      in response to determining that the read command comprises the indication for enabling the ARL determination, determine at least one adjusted read voltage for the at least one block by determining, for each of the respective blocks in the planes, a different corresponding adjusted read voltage; and
      execute a multi-plane read operation based on the at least one adjusted read voltage according to the read command.

22. The memory system of claim 21, wherein the memory device is configured to:
   sequentially receive a respective specified command for each plane of the planes from the memory controller, the respective specified command comprising corresponding ARL information for determining the different corresponding adjusted read voltage for the respective block in the plane;
   sequentially receive a respective read command for each plane of the planes from the memory controller;
   determine, for each of the respective blocks in the planes, the different corresponding adjusted read voltage based on the corresponding ARL information and the respective read command;
   execute the multi-plane operation based on the corresponding adjusted read voltages for the respective blocks in the planes according to the respective read commands; and
   sequentially output respective memory data read from each of the respective blocks in the planes to the memory controller.

23. A memory system comprising:
   a memory device comprising a plurality of blocks; and
   a memory controller coupled to the memory device and configured to send a read command to the memory device, the read command comprising address information of at least one block in the memory device,
   wherein the memory device is configured to:
      determine whether the read command comprises an indication for enabling adjusted read level (ARL) determination;
      in response to determining that the read command comprises the indication for enabling the ARL determination, determine at least one adjusted read voltage for the at least one block; and
      execute: a read operation based on the at least one adjusted read voltage according to the read command, and
   wherein the read command comprises a prefix cycle code and a command cycle code, and wherein one of the prefix cycle code and the command cycle code is configured to include the indication for enabling the ARL determination.

* * * * *